(12) United States Patent
Gathman et al.

(10) Patent No.: US 10,153,934 B1
(45) Date of Patent: Dec. 11, 2018

(54) RECONFIGURABLE WIDEBAND CURRENT-MODE FILTERS

(71) Applicant: QUALCOMM Incorporated, San Diego, CA (US)

(72) Inventors: Timothy Donald Gathman, San Diego, CA (US); Chirag Dipak Patel, San Diego, CA (US); Lai Kan Leung, San Marcos, CA (US); Xinmin Yu, San Diego, CA (US); Rajagopalan Rangarajan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/730,040

(22) Filed: Oct. 11, 2017

(51) Int. Cl.
 *H04B 1/16* (2006.01)
 *H04L 27/26* (2006.01)
 *H04L 27/01* (2006.01)
 *H04B 7/08* (2006.01)

(52) U.S. Cl.
 CPC ......... *H04L 27/2688* (2013.01); *H04B 7/084* (2013.01); *H04L 27/01* (2013.01)

(58) Field of Classification Search
 CPC .. H04B 1/30; H04B 1/18; H04B 7/084; H04L 25/08; H04L 27/01; H04L 27/2688; H03F 1/086; H03F 3/4521; H03F 3/45475; H03F 3/45636; H03F 2203/45318; H03F 2203/45526
 See application file for complete search history.

(56) References Cited

U.S. PATENT DOCUMENTS

| | | | |
|---|---|---|---|
| 7,899,426 B2 | 3/2011 | Tasic et al. | |
| 9,065,703 B2* | 6/2015 | Jung | ........................ H04B 1/18 |
| 9,246,438 B2 | 1/2016 | Mikhemar et al. | |
| 9,467,238 B2 | 10/2016 | Dhayni et al. | |
| 9,712,140 B1* | 7/2017 | Salvi | .................... H04B 1/1081 |
| 2004/0184562 A1* | 9/2004 | Wang | .................... H03D 3/009 |
| | | | 375/322 |
| 2010/0029323 A1* | 2/2010 | Tasic | .................... H03G 3/3052 |
| | | | 455/550.1 |

OTHER PUBLICATIONS

Fan X., et al., "A Reconfigurable 0.7-2.6GHz Wideband Mixer for Multi-mode Multi-standard Receivers in 0.18 µm RF CMOS", IEEE MTT-S International Microwave Workshop Series on Advanced Materials and Processes for RF and THz Applications (IMWS-AMP), Nov. 2015, pp. 1-3.

Yu X., et al., "A Fully-Integrated Reconfigurable Dual-Band Transceiver for Short Range Wireless Communications in 180 nm CMOS", IEEE Journal of Solid-State Circuits, vol. 50, No. 11, Nov. 2015, pp. 2572-2590.

* cited by examiner

*Primary Examiner* — Thanh Le

(74) *Attorney, Agent, or Firm* — Qualcomm Incorporated

(57) ABSTRACT

In certain aspects, a circuit comprises a low noise amplifier (LNA) configured to receive a radio frequency (RF) signal, a first mixer coupled to the low noise amplifier (LNA), and a first trans-impedance filter coupled to the first mixer. The first trans-impedance filter comprises a tunable inductor and capacitor (LC) network configured to be a portion of a doubly terminated LC ladder filter and a trans-impedance amplifier (TIA) coupled to the tunable inductor and capacitor (LC) network. The circuit further comprises a second mixer coupled to the low noise amplifier (LNA) and a second trans-impedance filter coupled to the second mixer.

30 Claims, 17 Drawing Sheets

US 10,153,934 B1

RECONFIGURABLE WIDEBAND CURRENT-MODE FILTERS

BACKGROUND

Field

Aspects of the present disclosure relate generally to wireless communication, and more particularly, to a method and apparatus to receive, amplify, and/or filter a high- or a low-bandwidth signal in a wireless communication system.

Background

Wireless communication services have enjoyed dramatic growth over the past few decades. Wireless communication technologies are being developed to satisfy the increasing demand and to provide more and better mobile communication applications and services. As more and more people become users of wireless communication systems, and more and more services are provided over these systems, there is an increasing need for mobile communication systems with larger capacity, higher throughput, lower latency, and better reliability. As a response to this demand, new generations of wireless communication technology with new capability have been constantly developed. Today, every major telecom technology supplier or provider is working on the next generation wireless communication technology, 5G. 5G is targeted to provide fast, stable, and ubiquitous voice and data connection for smartphones, watches, homes, cars, and any other appliances. Like current wireless communication technology, 4G (e.g., LTE), and previous generation, 3G (e.g., UMTS), 5G is a wireless connection built specifically to keep up with the proliferation of devices that need a mobile connection. 5G promises to allow people to send texts, make calls and browse the web as always—and it will dramatically increase the speed at which data is transferred across the network. 5G will make it easier for people to download and upload Ultra HD and 3D video. It will also make room for the thousands of internet-connected devices entering our everyday world.

For 3G or 4G RF signals with a bandwidth less than 100 MHz, the receiver baseband filter often uses a conventional operational trans-conductance amplifier (OTA) RC filter for its good noise/linearity performance. FIG. 1 illustrates one of such examples. A receiver 100 comprises a low noise amplifier (LNA) 102. The low noise amplifier (LNA) 102 amplified an RF signal. The amplified RF signal, typically in current mode, from the low noise amplifier (LNA) 102 couples to both I-Channel and Q-Channel. It is down-converted by an in-phase mixer 104I in the I-Channel and a quadrature-phase mixer 104Q in the Q-Channel to zero intermediate frequency (ZIF) or intermediate frequency (IF) signals. The in-phase mixer 104I and the quadrature-phase mixer 104Q are driven by differential local oscillator signals (not shown) with a 90-degree phase offset. Typically, the differential local oscillator signals have a duty cycle of 25% or less to reduce coupling between the I-Channel and the Q-Channel. The down-converted signals in both I-Channel and Q-Channel couple to respective operational trans-conductance amplifier (OTA) RC filters 106I and 106Q before they couple to a baseband processor (not shown). For low-bandwidth (e.g., less than 80 MHz) signals, the operational trans-conductance amplifier (OTA) RC filters 106I and 106Q have low noise and good linearity due to the strong active feedback (through resistors RFB and capacitors CFB).

However, operational trans-conductance amplifier RC (OTA-RC) filters, such as the operational trans-conductance amplifier RC (OTA-RC) filters 106I and 106Q, designed to have a bandwidth greater than 100 MHz may suffer from low loop gain and gain inaccuracy, filter response inaccuracy, high noise, and/or poor linearity. Furthermore, for 5G wireless communication with a millimeter wavelength (mmWave) RF signal, it is challenging to generate high-frequency low duty cycle local oscillator signals. For a conventional OTA-RC filter, 50% duty cycle local oscillator signals increase the I-Q cross-talk and hurt OTA-RC filter performance. There is a desire to have an alternative filter architecture that has high linearity and bandwidth, low noise, and low power consumption for the ultra-high-capacity wireless RF front-end, which may operate at mmWave spectrum (e.g., in the frequency bands above 24 GHz) and with IF or baseband bandwidth exceeding 100 MHz (e.g., around 400 MHz).

SUMMARY

The following presents a simplified summary of one or more implementations to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

In one aspect, a circuit comprises a low noise amplifier (LNA) configured to receive a radio frequency (RF) signal, a first mixer coupled to the low noise amplifier (LNA), and a first trans-impedance filter coupled to the first mixer. The first trans-impedance filter comprises a tunable inductor and capacitor (LC) network configured to be a portion of a doubly terminated LC ladder filter and a trans-impedance amplifier (TIA) coupled to the tunable inductor and capacitor (LC) network. The circuit further comprises a second mixer coupled to the low noise amplifier (LNA) and a second trans-impedance filter coupled to the second mixer.

In another aspect, a method comprises amplifying a radio frequency (RF) signal by a low noise amplifier (LNA) to generate an amplified RF signal; down-converting the amplified RF signal by a first mixer to generate a first low-frequency signal; and amplifying and filtering the first low-frequency signal by a first trans-impedance filter to generate a first baseband signal. The method further comprises down-converting the amplified RF signal by a second mixer to generate a second low-frequency signal; and amplifying and filtering the second low-frequency signal by a second trans-impedance filter to generate a second baseband signal. The first trans-impedance filter comprises a tunable inductor and capacitor (LC) network configured to be a portion of a doubly terminated LC ladder filter and a trans-impedance amplifier (TIA) coupled to the tunable inductor and capacitor (LC) network.

In another aspect, a circuit comprises means for amplifying a radio frequency (RF) signal and generating an amplified RF signal; means for down-converting the amplified RF signal and generating a first low-frequency signal; and means for amplifying and filtering the first low-frequency signal and generating a first baseband signal. The means for amplifying and filtering the first low-frequency signal and generating a first baseband signal comprises a tunable inductor and capacitor (LC) network configured to be a portion of a doubly terminated LC ladder filter; and a trans-impedance amplifier (TIA) coupled to the tunable inductor and capacitor (LC) network; the circuit further comprises means for down-converting the amplified RF signal and generating a second low-frequency signal; and means for amplifying and filtering the second low-frequency signal and generating a second baseband signal.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the described implementations are intended to include all such aspects and their equivalents.

DETAILED DESCRIPTION

Figure 1:
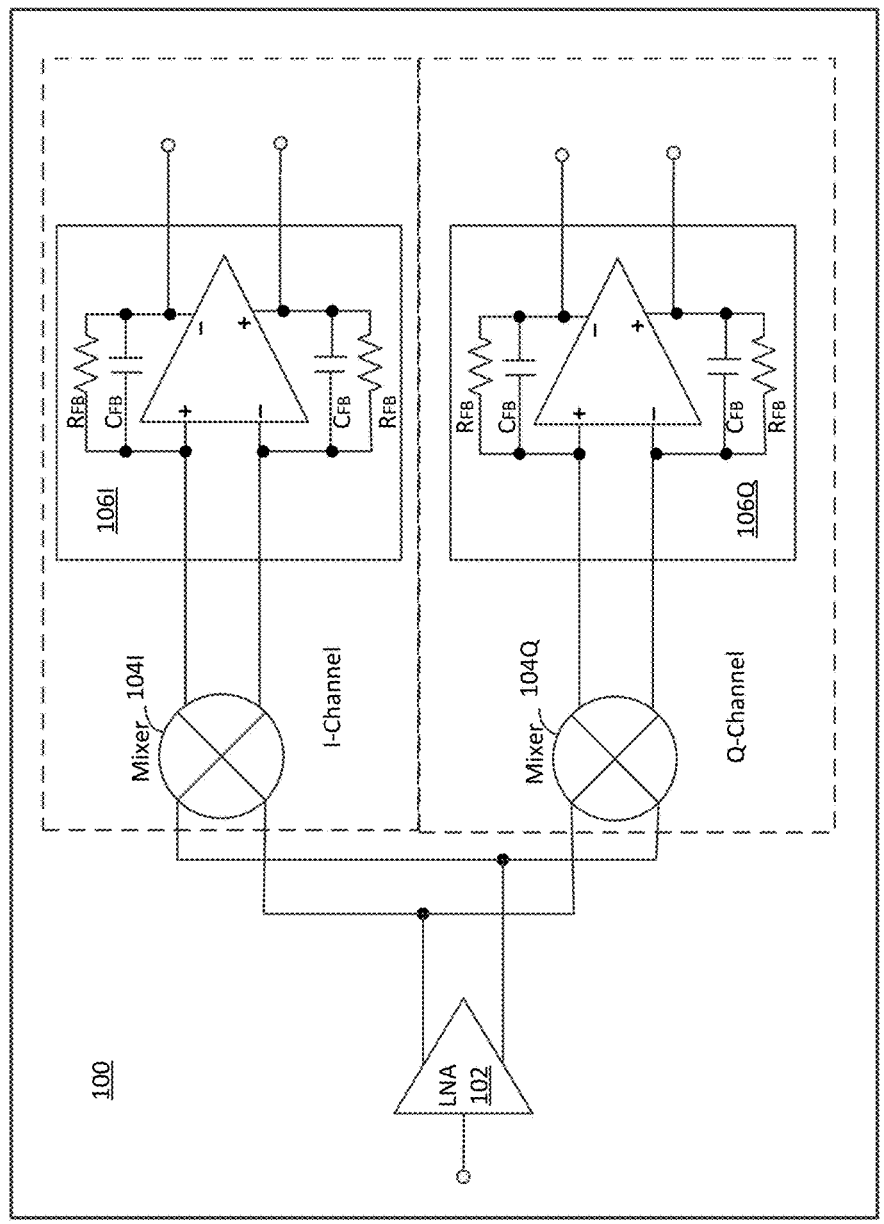
FIG. 1 illustrates an example of an RF front-end receiver for low-bandwidth signals.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

An ultra-high-capacity 5G wireless communication requires an RF front-end to operate at millimeter wave (mmWave) spectrum (e.g., in the frequency bands above 24 GHz) with IF or baseband bandwidth exceeding 100 MHz (e.g., around 400 MHz). For RF signals with bandwidths less than 100 MHz, conventional receiver baseband filters use operational trans-conductance amplifier (OTA) RC filters for good noise/linearity performance. However, implementing filters having an IF or baseband bandwidth far greater than 100 MHz without suffering from low loop gain and gain inaccuracy, filter response inaccuracy, high noise, and/or poor linearity is difficult. The 5G devices may require an alternative receiver and/or receiver baseband filter architecture. The active filter of a conventional receiver may be replaced by a current mode filter with a doubly terminated LC ladder filter and/or an open-loop trans-impedance amplifier (TIA). The bandwidth of the filter is programmable with a tunable inductor and capacitor (LC) network. The programmability of the bandwidth enables one receiver to support both high-bandwidth mmWave spectrum in one mode and low-bandwidth of legacy spectrum in another mode. The mmWave RF and IF up/downconverters for a 5G RF front-end prefer to use large duty-cycle (e.g., 50% or close to 50%) local oscillator signals. Taking advantage of the large duty cycle local oscillator signals and shared LNA for both I-Channel and Q-Channel, it may not be necessary to have a dedicated resistor serving as the source impedance for the current mode filter. The low noise amplifier (LNA), the I-Channel mixer, and the Q-Channel mixer may provide an equivalent impedance that serves as the source impedance of the filter.

An open-loop trans-impedance amplifier (TIA) can work well with high-bandwidth signals. The trans-impedance amplifier (TIA) may have a high bandwidth due to the lack of a closed-loop feedback path. High linearity may be achieved through complementary current mirror loads. The gain of the amplifier may be tuned through adjusting the load currents passing through the current mirrors. The load currents may be tuned to a lower amount when the amplifier is operated in a mode with a lower bandwidth signal, thus reducing the power consumption and noise level. Further, when the trans-impedance amplifier (TIA) is coupled with a doubly terminated LC ladder filter, the design minimizes the use of active devices, which results in low overall noise.

Figure 2:
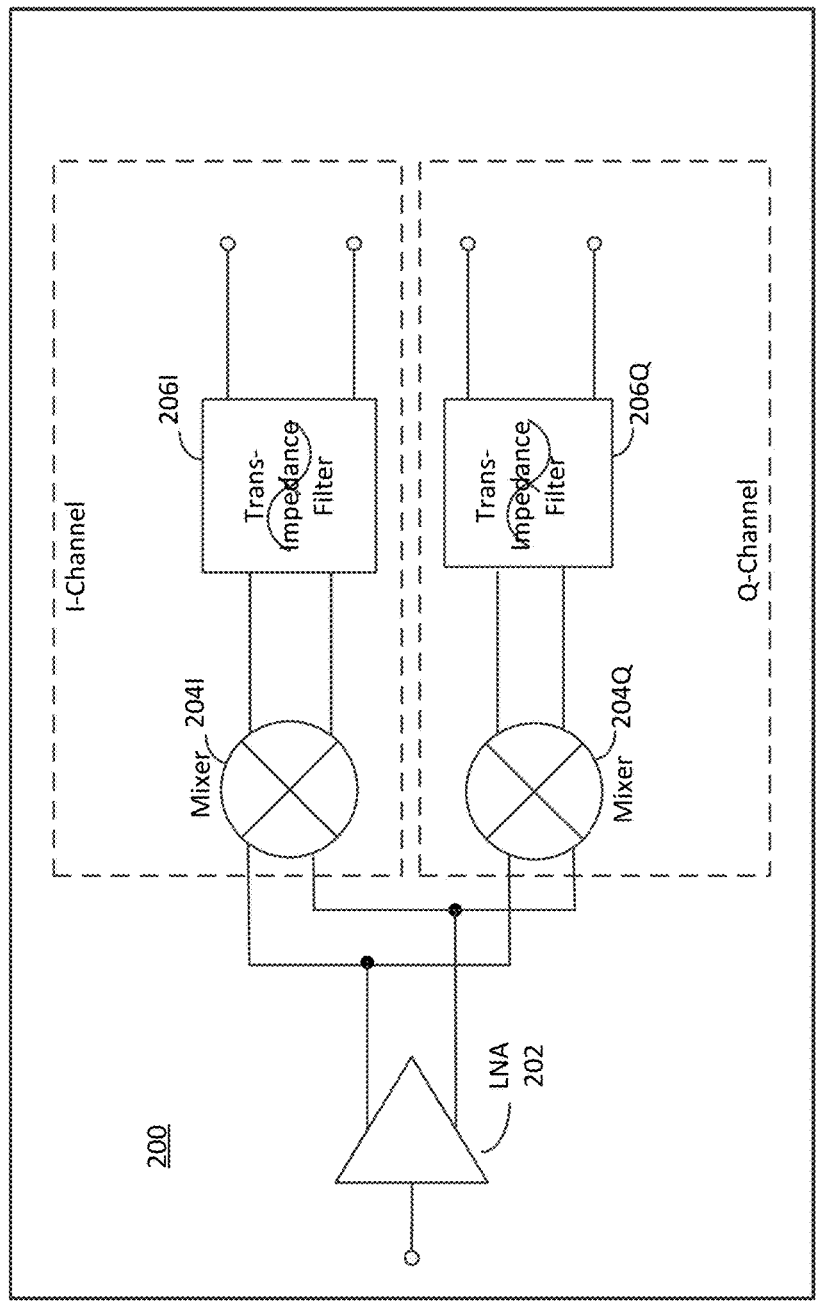
FIG. 2 illustrates an example of an RF front-end receiver for high-bandwidth signals according to certain aspects of the present disclosure.

FIG. 2 illustrates an example of an RF front-end receiver for high-bandwidth signals according to certain aspects of the present disclosure. The receiver 200 comprises a low noise amplifier (LNA) 202, an in-phase mixer 204I, an in-phase trans-impedance filter 206I, a quadrature-phase mixer 204Q, and a quadrature-phase trans-impedance filter 206Q. The low noise amplifier (LNA) 202 couples to an antenna (not shown). The antenna picks up the RF signal from the air and couples the RF signal to the low noise amplifier (LNA) 202. The low noise amplifier (LNA) 202 amplifies the RF signal. The low noise amplifier (LNA) 202 is shared by both I-Channel and Q-Channel. The amplified RF signal from the low noise amplifier (LNA) 202 couples to both I-Channel and Q-Channel. It is down-converted by the mixers formed by the in-phase mixer 204I in the I-Channel and the quadrature-phase mixer 204Q in the Q-Channel. Between the low noise amplifier (LNA) 202 and the mixers 204I and 204Q, there may be capacitors (not shown) to block DC signals. The RF signal is down-converted to a zero intermediate (ZIF) signal or an intermediate frequency (IF) signal in both channels, with quadrature-phase shift. The down-converted current signals are processed by the trans-impedance filters, 206I and 206Q, respectively.

Figure 3:
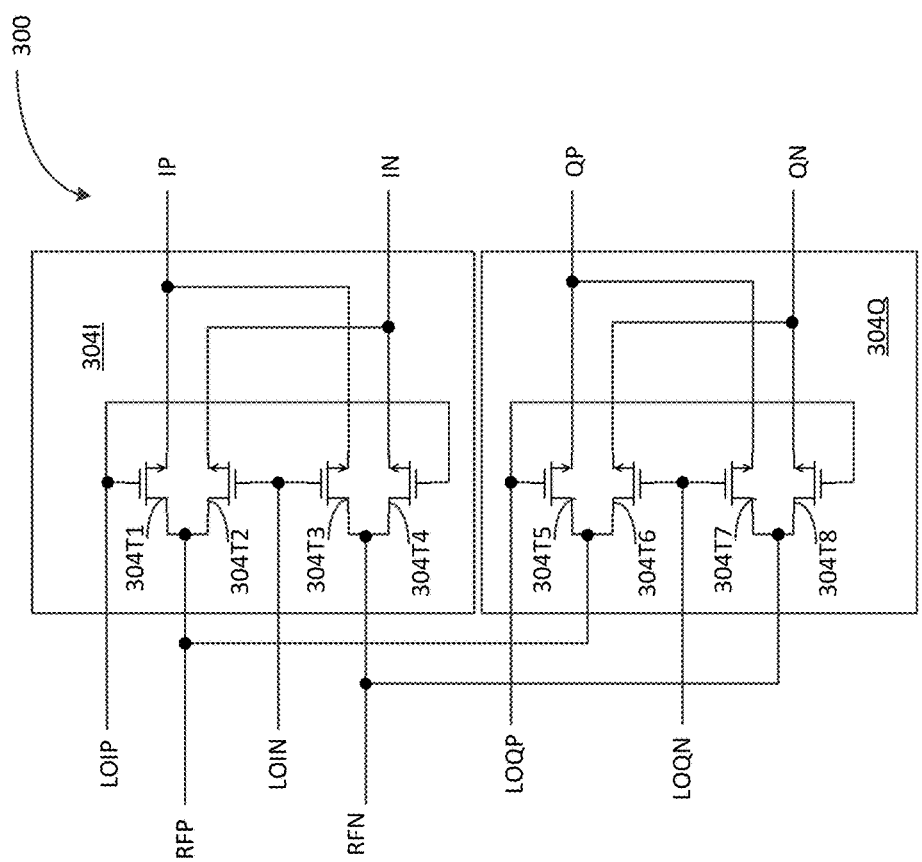
FIG. 3 illustrates an exemplary implementation of both in-phase and quadrature-phase mixers according to certain aspects of the present disclosure.

FIG. 3 illustrates an exemplary implementation of both in-phase and quadrature-phase mixers according to certain aspects of the present disclosure. The implementation 300 comprises an in-phase mixer 304I and a quadrature-phase mixer 304Q. The in-phase mixer 304I and the quadrature-phase mixer 304Q may be used for the in-phase and quadrature-phase mixers 204I and 204Q, respectively. The in-phase mixer 304I and the quadrature-phase mixer 304Q illustrated in FIG. 3 are passive mixers. A passive mixer has good linearity and may require small voltage headroom. It also has a low noise figure due to the lack of active DC current. However, other alternatives, such as active mixers, are possible.

The differential RF input signals, RFP and RFN, are the differential output signals from a low noise amplifier (LNA), such as the low noise amplifier (LNA) 202. Increasingly, integrated circuits (ICs) having complementary metal-oxide semiconductor (CMOS) technology are being used in radio frequency (RF) circuits, including radio frequency (RF) circuits for wireless networks. The in-phase mixer 304I and the quadrature-phase mixer 304Q are such examples. The in-phase mixer 304I comprises NMOS transistors 304T1, 304T2, 304T3, and 304T4. The quadrature-phase mixer 304Q comprises NMOS transistors 304T5, 304T6, 304T7, and 304T8. However, both mixers may be implemented in various other semiconductor technologies such as silicon and gallium arsenide with diodes, bipolar junction transistors (BJT), or other variations of these types.

Figure 4:
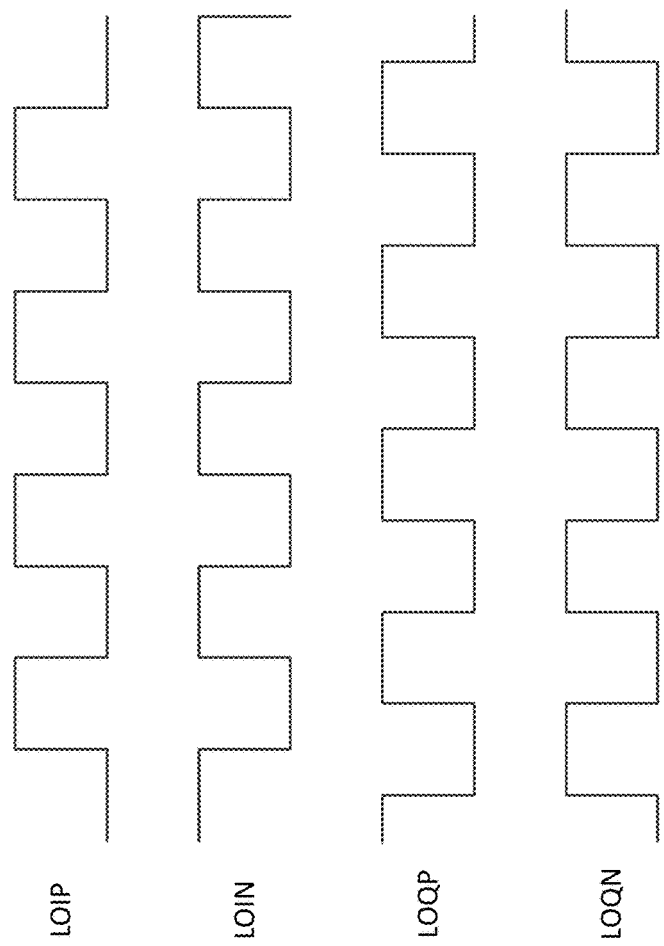
FIG. 4 illustrates exemplary waveforms of local oscillator signals according to certain aspects of the present disclosure.

The differential RF input signals, RFP and RFN, are mixed with differential local oscillator signals, LOIP and LOIN, in the in-phase mixer 304I. Similarly, the differential RF input signals, RFP and RFN, are mixed with complementary differential local oscillator signals, LOQP and LOQN, in the quadrature-phase mixer 304Q. The differential local oscillator signals, LOIP and LOIN, are shifted about 180 degrees in phase relative to one another, so are the differential local oscillator signals, LOQP and LOQN, as illustrated as one of the examples in FIG. 4. Furthermore, the corresponding local oscillator signals for the in-phase mixer 304I and the quadrature-phase mixer 304Q are shifted about 90 degrees in phase relative to one another. In other words, the local oscillator signal LOQP is shifted 90 degrees relative to the local oscillator signal LOIP, and the local oscillator signal LOQN is shifted 90 degrees relative to the local oscillator signal LOIN, as illustrated in FIG. 4. The output of the in-phase mixer 304I and the quadrature-phase mixer 304Q are the in-phase differential baseband signals IP and IN and the quadrature-phase differential baseband signals QP and QN.

High performance conventional designs typically use low duty cycle for the local oscillator signals, LOIP, LOIN, LOQP, and LOQN. Because the low noise amplifier (LNA) is typically shared by both the I-Channel and the Q-Channel, the duty cycle used in the conventional design can be non-overlapping (e.g., 25%) and eliminates or minimizes the time that both the in-phase mixer and the quadrature-phase mixer operate simultaneously, thus minimizing the influence of switching noise, and minimizing in-phase and quadrature-phase signal overlap and/or cross-coupling. However, for a high-frequency RF signal, such as 5G wireless signal, it is necessary to use local oscillator signals with 50% duty cycle or close to 50% duty cycle for ease of design and low power consumption. FIG. 4 illustrates exemplary waveforms of local oscillator signals according to certain aspects of the present disclosure. At 50% duty cycle, the local oscillator signal LOIP is at high 50% of the time and the local oscillator signal LOIN is at high for another 50% of the time. Similarly, the local oscillator signal LOQP is at high 50% of the time and the local oscillator signal LOQN is at high for another 50% of the time. When such local oscillator signals are applied to the in-phase mixer 304I and the quadrature-phase mixer 304Q, respectively, the in-phase mixer 304I and the quadrature-phase mixer 304Q will both be on simultaneously. That is, when the duty cycle of the local oscillator signals is at 50%, at any given time, the local oscillator signals applied to the in-phase mixer 304I and the quadrature-phase mixer 304Q may be at logic high at the same time. As a result, some of the transistors 304T1, 304T2, 304T3, and 304T4 in the in-phase mixer 304I and some of the transistors 304T5, 304T6, 304T7, and 304T8 in the quadrature-phase mixer 304Q may turn on simultaneously. Thus, the signals in I-Channel and Q-Channel may cross over each other's path. Other duty cycle configurations are possible. If a duty cycle is less than 50%, then the in-phase mixer and the quadrature-phase mixer may not be on simultaneously all the time but only some of the time. When the duty cycle approaches 25%, the in-phase mixer and the quadrature-phase mixer on-time overlap may be insignificant if the rise-time and fall-time of the local oscillator signals are sufficiently small.

Figure 5:
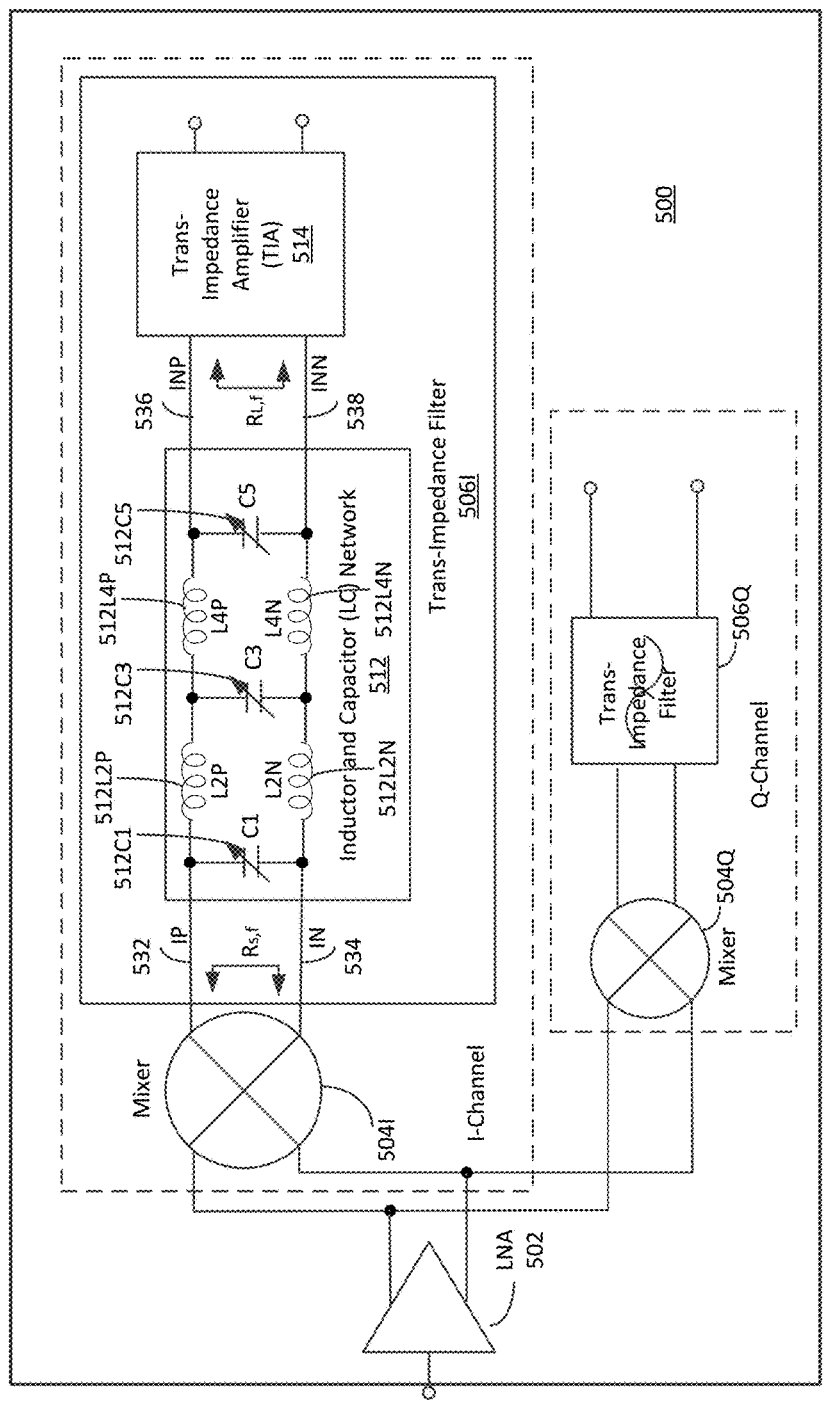
FIG. 5 illustrates an example of an RF front-end receiver for high-bandwidth signals with an exemplary implementation of a doubly terminated LC ladder filter and a trans-impedance amplifier (TIA) according to certain aspects of the present disclosure.

When the in-phase mixer and the quadrature-phase mixer are on simultaneously, the signals in the I-Channel and the Q-Channel may cross-couple and the impedance of one channel may load the other. Taking advantage of this effect, FIG. 5 illustrates an example of an RF front-end receiver for high-bandwidth signals according to certain aspects of the present disclosure. Like the receiver 200 in FIG. 2, the receiver 500 comprises a low noise amplifier (LNA) 502, an in-phase mixer 504I, and a trans-impedance filter 506I in the I-Channel; and a quadrature-phase mixer 504Q and a trans-impedance filter 506Q in the Q-Channel FIG. 5 further illustrates an exemplary implementation of the trans-impedance filter 506I comprising a tunable inductor and capacitor (LC) network 512 and a trans-impedance amplifier (TIA) 514 according to certain aspects of the present disclosure. The tunable inductor and capacitor (LC) network 512 is configured to be a portion of a doubly terminated LC ladder filter. The simultaneous loading effect of the in-phase and quadrature-phase mixers serves as the source resistance at the input of the LC network. A dedicated physical source resistor may not be needed.

The low noise amplifier (LNA) 502 may be the same or similar as the low noise amplifier (LNA) 202 in FIG. 2. The low noise amplifier (LNA) 502 couples to an antenna (not shown) or other off-chip preamplification components, such as a phased array transceiver (not shown). The RF signal is coupled to the low noise amplifier (LNA) 502. The low noise amplifier (LNA) 502 amplifies the RF signal. The low noise amplifier (LNA) 502 is coupled to both the I-Channel and the Q-Channel. The amplified RF signal from the low noise amplifier (LNA) 502 couples to two channels: I-Channel and Q-Channel. It is down-converted by mixers formed by the in-phase mixer 504I in the I-Channel and the quadrature-phase mixer 504Q in the Q-Channel. The in-phase mixer 504I and the quadrature-phase mixer 504Q can be the same or similar as the in-phase mixer 204I and the quadrature-phase mixer 204Q, respectively. And their design can be the same or similar as the one shown in FIG. 3. The local oscillator signals for the in-phase mixer 504I and the quadrature-phase mixer 504Q both have a relatively large duty cycle, such as 50% duty cycle, as shown in FIG. 4.

The RF signal from the low noise amplifier (LNA) 502 is down-converted to a zero intermediate (ZIF) or an intermediate frequency (IF) signal in both I-Channel and Q-Channel, with a quadrature-phase shift. For ease and clarity of the explanation, the following description focuses on the I-Channel. Details of I-Channel design are shown in FIG. 5. The implementation of Q-Channel typically follows the same architecture and typically with the same design.

The in-phase mixer 504I outputs the differential baseband signals IP and IN at terminals 532 and 534, respectively. The differential baseband signals IP and IN couple to the trans-impedance filter 506I at the terminals 532 and 534. The trans-impedance filter 506I comprises the tunable inductor and capacitor (LC) network 512 and the trans-impedance amplifier (TIA) 514. The tunable inductor and capacitor (LC) network 512 is configured to be a portion of a doubly terminated LC ladder filter. The tunable inductor and capacitor (LC) network 512 is composed of alternating series and shunt reactive elements, comprising inductors 512L2P, 512L4P, 512L2N, and 512L4N with inductance values L2P, L4P, L2N, and L4N, respectively, and capacitors 512C1, 512C3, and 512C5 with capacitance values C1, C3, and C5, respectively. FIG. 5 shows an exemplary implementation of LC ladder. Other alternatives, including different orders or different number of inductors and capacitors, are possible.

The bandwidth of the doubly terminated LC ladder filter is tunable. The bandwidth of the doubly terminated LC ladder filter may be programmed by a controller (not shown) based on the type of signal it is processing or the operating mode of the receiver. The receiver may operate to receive 2G, 3G, 4G, or 5G signals or other wireless signals or combination thereof. The bandwidth tuning of the doubly terminated LC ladder filter may be performed through the tunable inductor and capacitor (LC) network 512 by programming the capacitors 512C1, 512C3, and/or 512C5 to vary the corresponding capacitance values C1, C3, and/or C5. Alternatively, the bandwidth tuning of the doubly terminated LC ladder filter may be performed through the tunable inductor and capacitor (LC) network 512 by programming the inductors 512L2P, 512L4P, 512L2N, and/or 512L4N to vary the corresponding inductance values L2P, L4P, L2N, and/or L4N. Alternatively, the bandwidth tuning of the doubly terminated LC ladder filter may be performed through the tunable inductor and capacitor (LC) network 512 by programming both the capacitors 512C1, 512C3, and/or 512C5 to vary the corresponding capacitance values C1, C3, and/or C5 and the inductors 512L2P, 512L4P, 512L2N, and/or 512L4N to vary the corresponding inductance values L2P, L4P, L2N, and/or MN.

Figure 6:
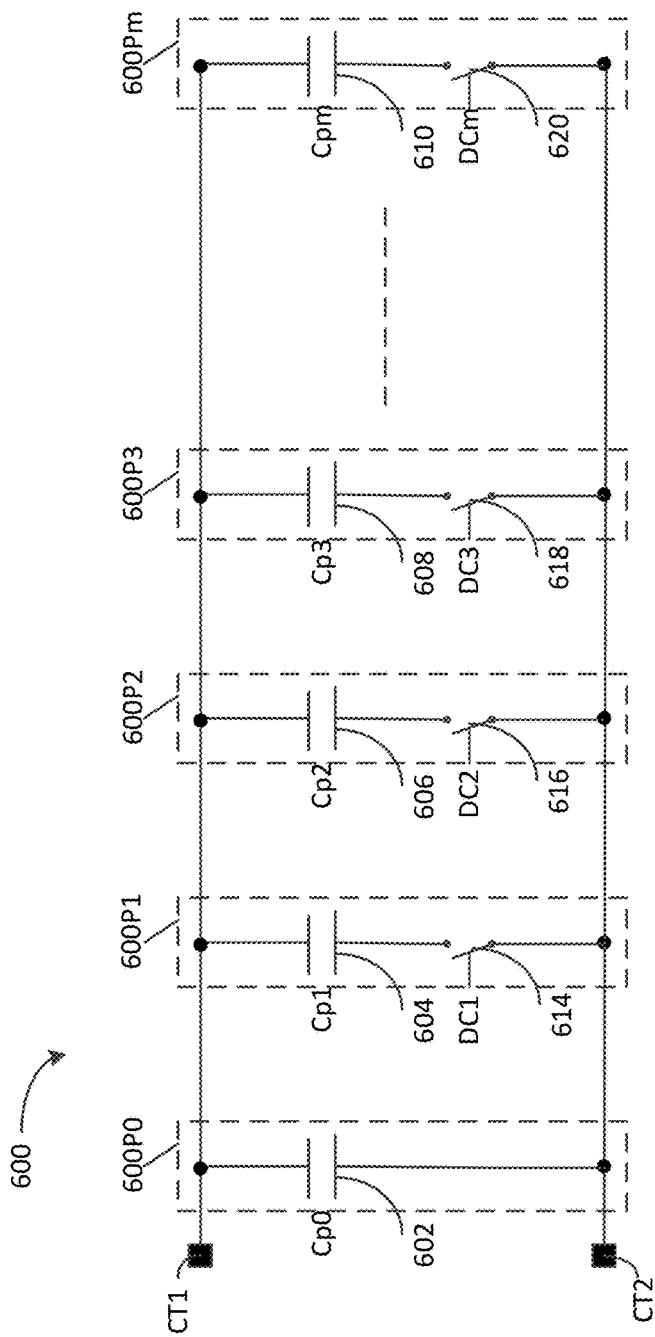
FIG. 6 illustrates an exemplary implementation of a programmable capacitor network according to certain aspects of the present disclosure.

FIG. 6 illustrates an exemplary implementation of a programmable capacitor network according to certain aspects of the present disclosure. The design may be used for one or more of the capacitors 512C1, 512C3, and 512C5. In FIG. 6, a programmable capacitor array 600 comprises two terminals CT1 and CT2 and a plurality of paths 600P0, 600P1, 600P2, 600P3, . . . , 600Pm. Path 600P0 is optional and comprises a fixed capacitor 602 with capacitance value Cp0. The fixed capacitor 602 sets the minimum capacitance value between terminals CT1 and CT2 to be Cp0. Each of the plurality of the remaining paths 600P1, 600P2, 600P3, . . . , 600Pm comprises a capacitor and a switch. For example, path 600P1 comprises a capacitor 604 with a capacitance value Cp1 and a switch 614; path 600P2 comprises a capacitor 606 with a capacitance value Cp2 and a switch 616; path 600P3 comprises a capacitor 608 with a capacitance value Cp3 and a switch 618; and path 600Pm comprises a capacitor 610 with a capacitance value Cpm and a switch 620. The capacitance values Cp1, Cp2, Cp3 Cpm may be substantially the same or may be different. For example, one may choose to have the capacitance values Cp1, Cp2, Cp3 . . . , Cpm in binary order, such as Cp2 is twice of Cp1, Cp3 is twice of Cp2, and so on. Each of the switches 614, 616, 618, . . . , 620 has a control terminal that turns the switch on or off when an appropriate signal is applied. When the switch is turned on, the capacitor of the path contributes to the overall capacitance between the two terminals CT1 and CT2. When the switch is off, the capacitor of the path does not contribute to the overall capacitance between the two terminals CT1 and CT2. The control signals DC1, DC2, DC3, . . . , DCm for respective switches 614, 616, 618, . . . , 620 may be digital or analog and may come from a dedicated controller (not shown).

The programmable capacitor array 600 in FIG. 6 is one exemplary embodiment of the programmable capacitors 512C1, 512C3, and 512C5 in FIG. 5. The number of paths for 512C1, 512C3, and 512C5 may be different, so is the specific sizes of switches 614, 616, 618, . . . , 620 and the capacitance values Cp1, Cp2, Cp3 . . . , Cpm. Other alternatives are possible. For example, varactors may be used as programmable capacitors 512C1, 512C3, and 512C5. A MOS transistor is one type of a varactor. It is well known that a MOS transistor with drain, source, and bulk connected together realizes a MOS capacitor with capacitance value dependent on the voltage between bulk and gate. Furthermore, the programmable capacitors 512C1, 512C3, and 512C5 may be designed differently. They may be programmed with a same capacitance value or with different capacitance values.

Back to FIG. 5. The tunable inductor and capacitor (LC) network 512 couples to the trans-impedance amplifier (TIA) 514 at terminals 536 and 538, where the trans-impedance amplifier (TIA) 514 receives its differential input signals INP and INN.

Figure 7:
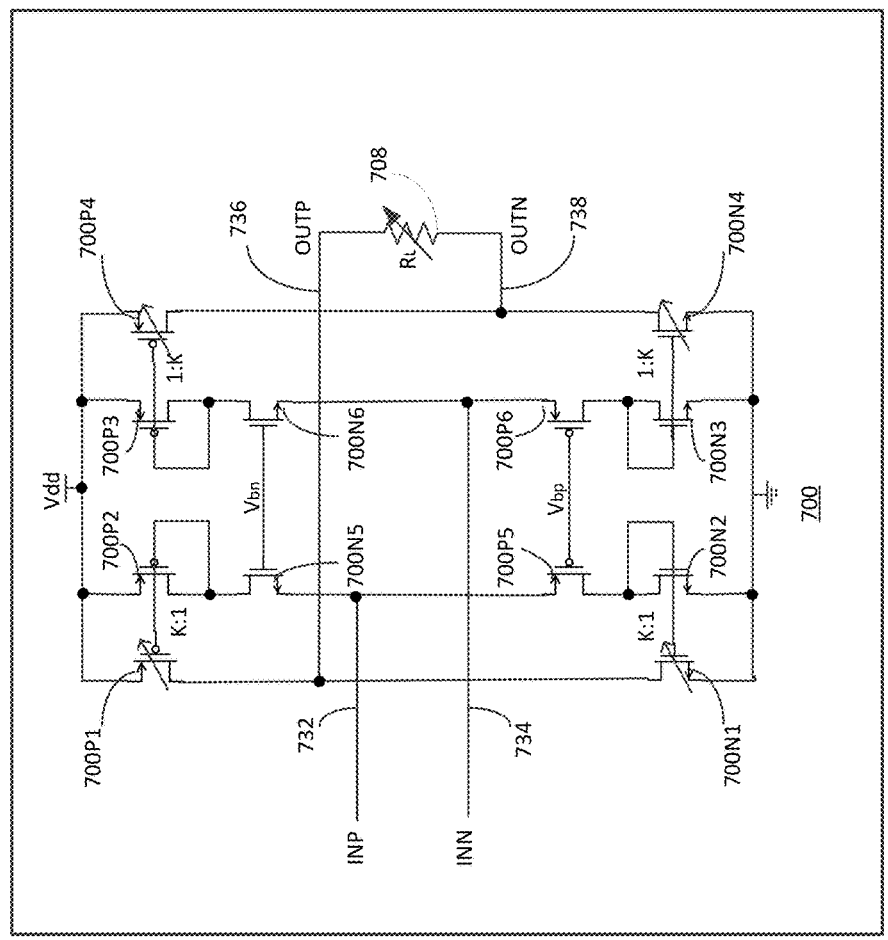
FIG. 7 illustrates an exemplary implementation of a trans-impedance amplifier (TIA) according to certain aspects of the present disclosure.

FIG. 7 illustrates an exemplary implementation of a trans-impedance amplifier (TIA) according to certain aspects of the present disclosure. The trans-impedance amplifier (TIA) 700 may be used for the trans-impedance amplifier (TIA) 514 in FIG. 5. The trans-impedance amplifier (TIA) 700 is a Class-AB amplifier. It comprises an NMOS common-gate amplifier formed by an NMOS transistor pair, 700N5 and 700N6, and a PMOS common-gate amplifier formed by a PMOS transistor pair, 700P5 and 700P6. The gates of the NMOS transistor pair 700N5 and 700N6 are biased at Vbn. Likewise, the gates of the PMOS transistor pair 700P5 and 700P6 are biased at Vbp. The bias voltages Vbn and Vbp may be the same or different. The range of the bias voltages could be any voltage between supply voltage Vdd and ground. The differential input INP is coupled to the source terminals of the transistors 700N5 and 700P5. The differential input INN is coupled to the source terminals of the transistors 700N6 and 700P6. The differential output of the trans-impedance amplifier (TIA) 700 are OUTP 736 and OUTN 738. The differential output OUTP 736 and OUTN 738 couples to a load resistor $R_L$ 708.

The trans-impedance amplifier (TIA) 700 is configured to be open-loop. There is no path from the output of the amplifier back to the amplifier input. Thus, there is no common-mode feedback to bias the trans-impedance amplifier 700. The bias voltages Vbp and Vbn of the trans-impedance amplifier (TIA) 700 are not generated through the feedback of output signals OUTP or OUTN or both. Instead, the bias voltages Vbp and Vbn may be fixed. They may be generated using a replica bias, simple voltage dividers, or bandgap voltage reference generators. Other alternatives are possible.

The NMOS common-gate amplifier is loaded with a load current provided by a respective PMOS current mirror. The PMOS current mirrors comprise PMOS transistors 700P1, 700P2, 700P3, and 700P4. Likewise, the PMOS common-gate amplifier is loaded with a load current provided by a respective NMOS current mirror. The NMOS current mirrors comprise NMOS transistors 700N1, 700N2, 700N3, and 700N4. The output currents of 700P1, 700N1, 700P4, and 700N4 drive the load impedance $R_L$, connected at the output terminals 736 and 738, and produce the differential output signals OUTP and OUTN.

Both the PMOS current mirrors and the NMOS current mirrors may be programmable. The output currents to the load impedance $R_L$ may be adjusted by tuning PMOS transistors 700P1 and 700P4 and NMOS transistors 700N1 and 700N4. This may be achieved by changing the effective sizes of the PMOS transistors 700P1 and 700P4 and the NMOS transistors 700N1 and 700N4 accordingly.

Figure 8A:
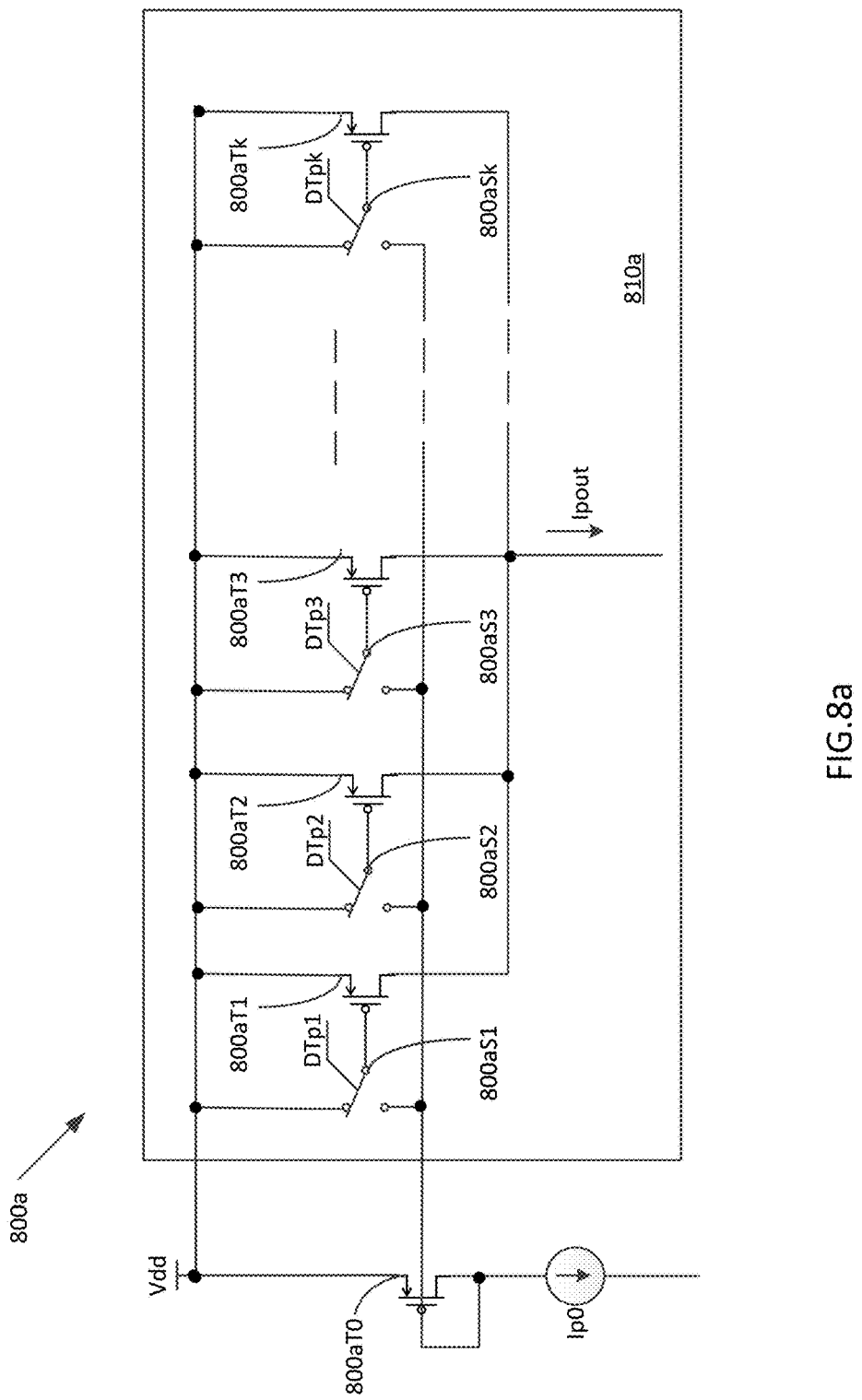
FIG. 8a illustrates an exemplary implementation of a programmable PMOS current mirror according to certain aspects of the present disclosure.

FIG. 8a illustrates an exemplary implementation of a programmable PMOS current mirror according to certain aspects of the present disclosure. The implementation 800a comprises a PMOS transistor 800aT0 and a PMOS array 810a. The PMOS array 810a comprises a plurality of PMOS transistors 800aT1, 800aT2, 800aT3, . . . , 800aTk. Typically, all the PMOS transistors 800aT0, 800aT1, 800aT2, 800aT3, . . . , 800aTk have the same channel lengths for better matching. The effective channel widths for the PMOS transistors 800aT0, 800aT1, 800aT2, 800aT3, . . . , 800aTk may be same or different. The PMOS transistor 800aT0 may be the PMOS transistor 700P2 or 700P3 in FIG. 7, and the PMOS array 810a may be the programmable PMOS transistor 700P1 or 700P4 in FIG. 7. The source current Ip0 is mirrored through the PMOS transistor 800aT0 to k current paths by the PMOS transistors 800aT1, 800aT2, 800aT3, . . . , 800aTk. The output current Ipout is the sum of the currents in each of the k current paths. Each of the k current paths is controlled by a respective one of k 3-way switches 800aS1, 800aS2, 800 aS3, . . . , 800aSk. Each of the 3-way switches 800aS1, 800aS2, 800 aS3, . . . , 800aSk determines whether the corresponding gate of each of the PMOS transistors 800aT1, 800aT2, 800aT3, . . . , 800aTk is electrically coupled to the gate of PMOS transistor 800aT0 or to a supply voltage Vdd. If the gate of any of the PMOS transistors 800aT1, 800aT2, 800aT3, . . . , 800aTk is electrically coupled to the gate of the PMOS transistor 800aT0, the corresponding PMOS transistor reproduces the current Ip0 in an amount approximately proportional to their size ratio and contributes to the output current Ipout. For example, if the gate of PMOS transistor 800aT1 is coupled to the gate of the PMOS transistor 800aT0, the current flowing through the source and drain of the PMOS transistor 800aT1 will be approximately $$\frac{W_{a1}/L_{a1}}{W_{a0}/L_{a0}}I_{p0},$$

where, $W_{a1}$ and $L_{a1}$ are the channel width and length of the PMOS transistor 800aT1, respectively; and $W_{a0}$ and $L_{a0}$ are the channel width and length of the PMOS transistor 800aT0, respectively. If the gate of any of the PMOS transistors 800aT1, 800aT2, 800aT3, . . . , 800aTk is electrically coupled to the supply voltage Vdd instead, then the corresponding PMOS transistor is turned off. No significant current flows through the transistor and the current path does not contribute to the overall output current Ipout. The 3-way switches 800aS1, 800aS2, 800 aS3, . . . , 800aSk are controlled by switch control signals DTp1, DTp2, DTp3, . . . , DTpk, respectively. The switch control signals DTp1, DTp2, DTp3, . . . , DTpk may come from a dedicated controller (not shown). One would recognize that a 3-way switch may be readily implemented as a multiplexer with two inputs and one output. Here the two inputs of the multiplexer are coupled to the gate of the PMOS transistor 800aT0 and the supply voltage Vdd, respectively, the output of the multiplexer is coupled to the gate of the PMOS transistors 800aT1, 800aT2, 800aT3, . . . , or 800aTk. The switch control signal DTp1, DTp2, DTp3, . . . , or DTpk is the multiplexer selection signal. However, the design is not limited to a multiplexer circuitry. Other designs that perform similar function may be used as well.

Figure 8B:
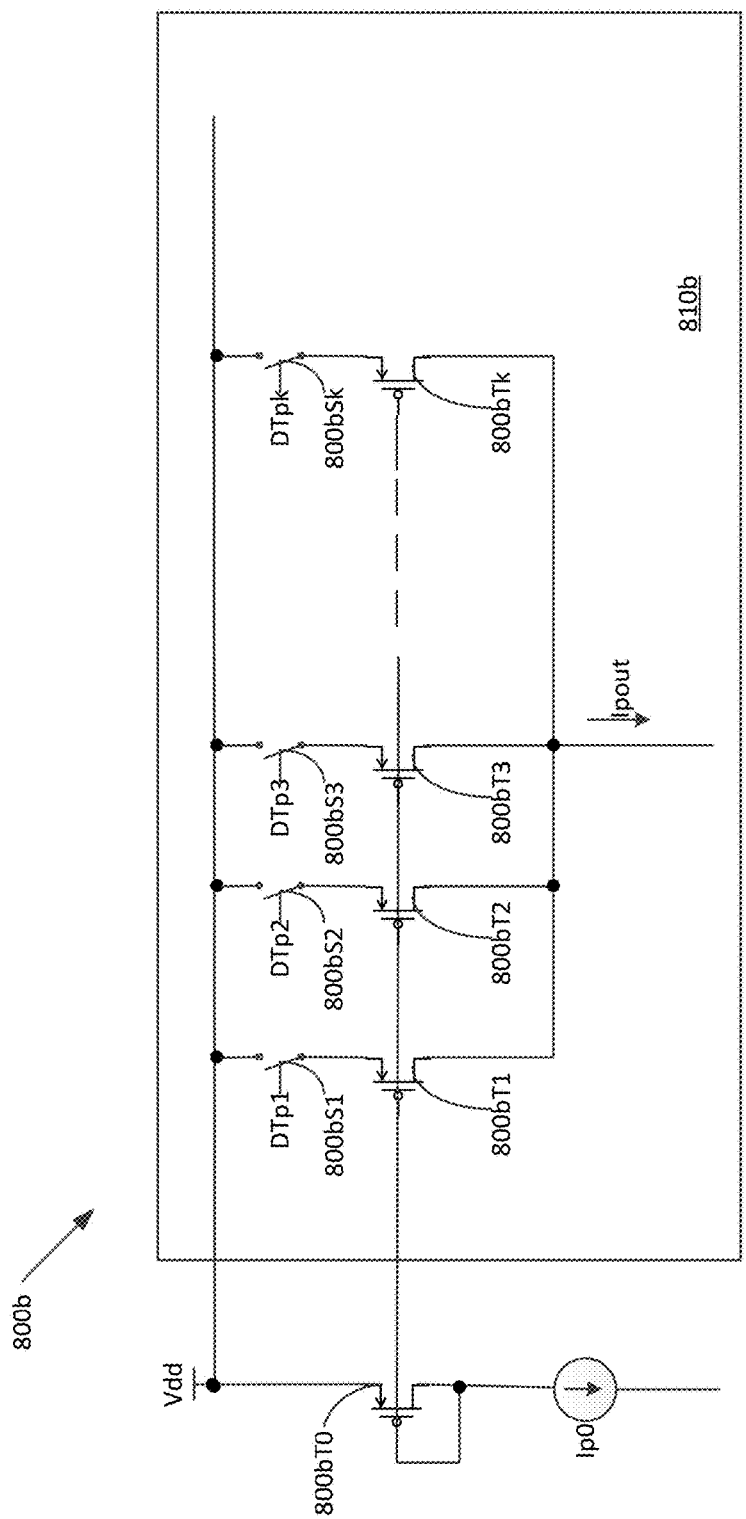
FIG. 8b illustrates still another exemplary implementation of a programmable PMOS current mirror according to certain aspects of the present disclosure.

FIG. 8b illustrates an alternative exemplary implementation of a programmable PMOS current mirror according to certain aspects of the present disclosure. The implementation 800b comprises a PMOS transistor 800bT0 and a PMOS array 810b. The PMOS array 810b comprises a plurality of PMOS transistors 800bT1, 800bT2, 800bT3, . . . , 800bTk. Typically, all the PMOS transistors 800bT0, 800bT1, 800bT2, 800bT3, . . . , 800bTk have the same channel lengths for better matching. The effective channel widths for the PMOS transistors 800bT0, 800bT1, 800bT2, 800bT3, . . . , 800bTk may be the same or different. The PMOS transistor 800bT0 may be the PMOS transistor 700P2 or 700P3 in FIG. 7, and the PMOS array 810b may be the programmable PMOS transistor 700P1 or 700P4 in FIG. 7. Like the exemplary implementation 800a in FIG. 8a, the implementation 800b comprises a source current with current Ip0. The source current Ip0 is mirrored through the PMOS transistor 800bT0 to k current paths by the PMOS transistors 800bT1, 800bT2, 800bT3, . . . , 800bTk. The output current Ipout is the sum of the currents in each of the k current paths. Each of the k current paths is controlled by a respective one of k simple switches 800bS1, 800bS2, 800bS3, . . . , 800bSk. Unlike FIG. 8a, in FIG. 8b, all gate terminals of the PMOS transistors 800bT0, 800bT1, 800bT2, 800bT3, . . . , 800bTk are hardwired and electrically coupled. The source terminals of the PMOS transistors 800bT1, 800bT2, 800bT3, . . . , 800bTk, however, are controlled by the switches 800bS1, 800bS2, 800bS3, . . . , 800bSk to determine whether each source terminal of the PMOS transistors 800bT1, 800bT2, 800bT3, . . . , 800bTk is electrically coupled to a supply voltage Vdd or is floating. If a source terminal of any PMOS transistors 800bT1, 800bT2, 800bT3, . . . , 800bTk is electrically coupled to the supply voltage Vdd, the corresponding PMOS transistor reproduces the current Ip0 in an amount proportional to their size ratio and contributes to the output current Ipout. For example, if the source of PMOS transistor 800bT1 is coupled to the supply voltage Vdd, the current flowing through the source and
drain of the PMOS transistor 800bT1 will be approximately $$\frac{W_{b1}/L_{b1}}{W_{b0}/L_{b0}} I_{p0},$$

where, $W_{b1}$ and $L_{b1}$ are the channel width and length of the PMOS transistor 800bT1, respectively; and $W_{b0}$ and $L_{b0}$ are the channel width and length of the PMOS transistor 800bT0, respectively. If a source terminal of any PMOS transistors 800bT1, 800bT2, 800bT3, . . . , 800bTk is not electrically coupled to the supply voltage Vdd but is floating, then no current flows through the transistor and therefore does not contribute to the overall output current Ipout. The switches 800bS1, 800bS2, 800bS3, . . . , 800bSk are controlled by switch control signals DTp1, DTp2, DTp3, . . . , DTpk, respectively. The switch control signals DTp1, DTp2, DTp3, . . . , DTpk may come from a dedicated controller (not shown). One would appreciate that each of the switches 800bS1, 800bS2, 800bS3, . . . , 800bSk may simply be a PMOS transistor with the gate coupled to a switch control signal. Alternatively, one may use a pass-gates or other logic performing a similar function as the switch 800bS1, 800bS2, 800bS3, . . . , or 800bSk.

Figure 8C:
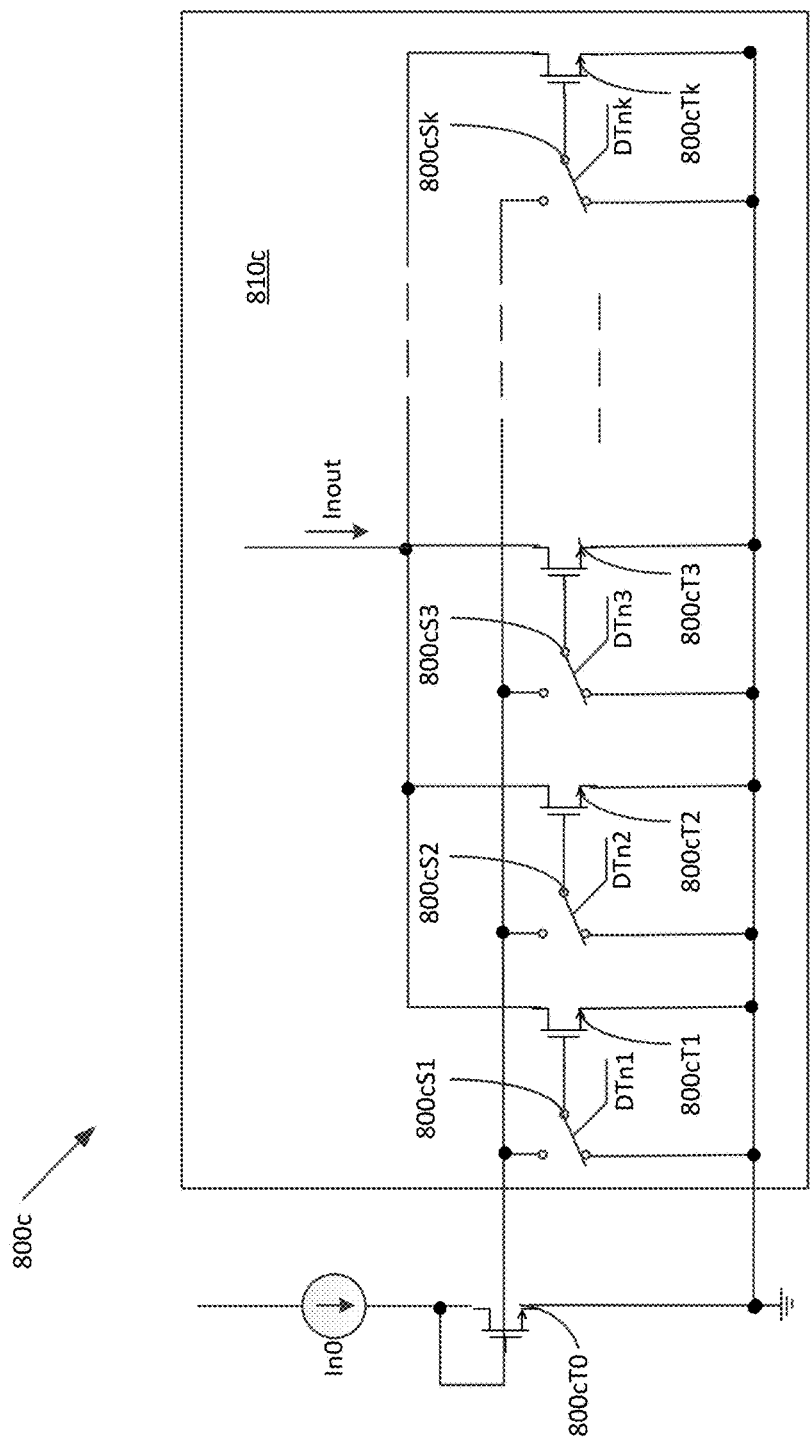
FIG. 8c illustrates an exemplary implementation of a programmable NMOS current mirror according to certain aspects of the present disclosure.

FIG. 8c illustrates an exemplary implementation of a programmable NMOS current mirror according to certain aspects of the present disclosure. The implementation 800c comprises an NMOS transistor 800cT0 and an NMOS array 810c. The NMOS array 810c comprises a plurality of NMOS transistors 800cT1, 800cT2, 800cT3, . . . , 800cTk. Typically, all the NMOS transistors 800cT0, 800cT1, 800cT2, 800cT3, . . . , 800cTk have the same channel lengths for better matching. The effective channel widths for the NMOS transistors 800cT0, 800cT1, 800cT2, 800cT3, . . . , 800cTk may be same or different. The NMOS transistor 800cT0 may be the NMOS transistor 700N2 or 700N3 in FIG. 7, and the NMOS array 810c may be the programmable NMOS transistor 700N1 or 700N4 in FIG. 7. The source current In0 is mirrored through the NMOS transistor 800cT0 to k current paths by the NMOS transistors 800cT1, 800cT2, 800cT3, . . . , 800cTk. The output current Inout is the sum of the currents in each of the k current paths. Each of the k current paths is controlled by a respective one of k 3-way switches 800cS1, 800cS2, 800cS3, . . . , 800cSk. Each of the k 3-way switches 800cS1, 800cS2, 800cS3, . . . , 800cSk determines whether the corresponding gate of each of the NMOS transistors 800cT1, 800cT2, 800cT3, . . . , 800cTk is electrically coupled to the gate of the NMOS transistors 800cT0 or to the ground. If the gate of any of the NMOS transistors 800cT1, 800cT2, 800cT3, . . . , 800cTk is electrically coupled to the gate of the NMOS transistor 800cT0, the corresponding NMOS transistor reproduces the current In0 in an amount proportional to its size ratio and contributes to the output current Inout. For example, if the gate of NMOS transistor 800cT1 is coupled to the gate of the NMOS transistor 800cT0, the current flowing through the source and drain of the NMOS transistor 800cT1 will be approximately $$\frac{W_{c1}/L_{c1}}{W_{c0}/L_{c0}} I_{n0},$$

where, $W_{c1}$ and $L_{c1}$ are the channel width and length of the NMOS transistor 800cT1, respectively; and $W_{c0}$ and $L_{c0}$ are the channel width and length of the NMOS transistor 800cT0, respectively. If the gate of any of the NMOS transistors 800cT1, 800cT2, 800cT3, . . . , 800cTk is electrically couple to the ground instead, then the corresponding NMOS transistor is turned off. No significant current flows through the transistor and the corresponding current path does not contribute to the overall output current Inout. The 3-way switches 800cS1, 800cS2, 800cS3, . . . , 800cSk are controlled by switch control signals DTn1, DTn2, DTn3, . . . , DTnk, respectively. The switch control signals DTn1, DTn2, DTn3, . . . , DTnk may come from a dedicated controller (not shown). Like the 3-way switches in FIG. 8a, the 3-way switch in FIG. 8c may be implemented as a multiplexer with two inputs and one output, too. Here the two inputs of the multiplexer are coupled to the gate of NMOS transistor 800cT0 and ground, respectively, the output of the multiplexer is connected to the gate of the NMOS transistors 800cT1, 800cT2, 800cT3, . . . , or 800cTk. The switch control signals DTn1, DTn2, DTn3, . . . , DTnk are the multiplexer selection signals. However, the design is not limited to a multiplexer circuitry. Other designs that perform similar function may be used as well.

Figure 8D:
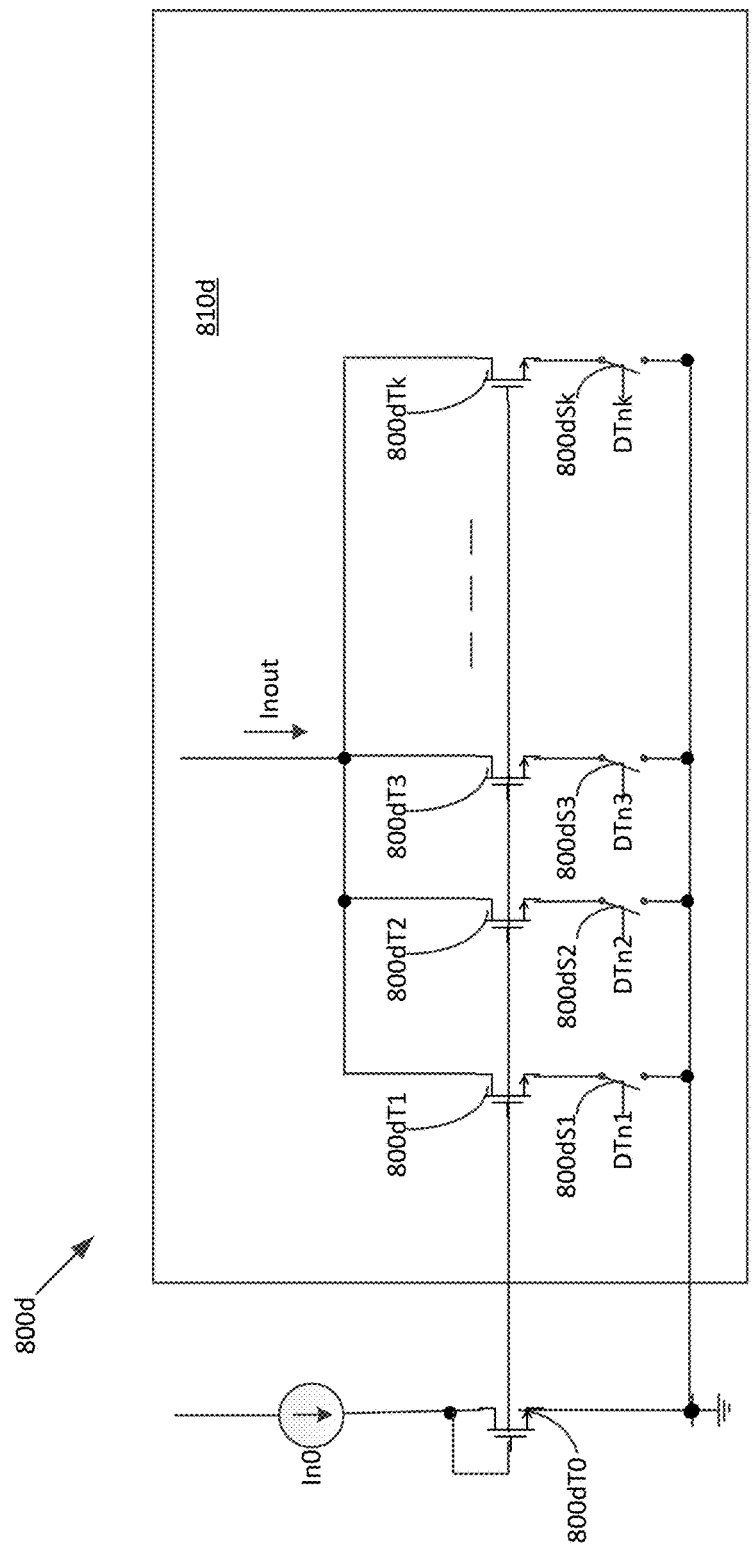
FIG. 8d illustrates still another exemplary implementation of a programmable NMOS current mirror according to certain aspects of the present disclosure.

FIG. 8d illustrates an alternative exemplary implementation of a programmable NMOS current mirror according to certain aspects of the present disclosure. The implementation 800d comprises an NMOS transistor 800dT0 and an NMOS array 810d. The NMOS array 810d comprises a plurality of NMOS transistors 800dT1, 800dT2, 800dT3, . . . , 800dTk. Typically, all the NMOS transistors 800dT0, 800dT1, 800dT2, 800dT3, . . . , 800dTk have the same channel lengths for better matching. The effective channel widths for the NMOS transistors 800dT0, 800dT1, 800dT2, 800dT3, . . . , 800dTk may be same or different. The NMOS transistor 800dT0 may be the NMOS transistor 700N2 or 700N3 in FIG. 7, and the NMOS array 810d may be the programmable NMOS transistor 700N1 or 700N4 in FIG. 7. Like the exemplary implementation 800b in FIG. 8b, the implementation 800d comprises a source current with current In0 and a plurality of NMOS transistors 800dT0, 800dT1, 800dT2, 800dT3, . . . , 800dTk. All gate terminals of the NMOS transistors 800dT0, 800dT, 800dT, 800dT3, . . . , 800dTk are electrically coupled together. Thus, the source current In0 is mirrored through the NMOS transistor 800dT0 to k current paths by the NMOS transistors 800dT1, 800dT2, 800dT3, . . . , 800dTk. The output current Inout is the sum of the currents in each of the k current paths. Each of the k current paths is controlled by a respective one of k simple switches 800dS1, 800dS2, 800dS3, . . . , 800dSk. The source terminals of the NMOS transistors 800dT1, 800dT2, 800dT3, . . . , 800dTk, however, are controlled by the switches 800dS1, 800dS2, 800dS3, . . . , 800dSk to determines whether each source terminal of the NMOS transistors 800dT1, 800dT2, 800dT3, . . . , 800dTk is electrically coupled to the ground or is floating. If a source terminal of any NMOS transistors 800dT1, 800dT2, 800dT3, . . . , 800dTk is electrically coupled to the ground, the corresponding NMOS transistor reproduces the current In0 in an amount proportional to their size ratio and contributes to the output current Inout. For example, if the source of NMOS transistor 800dT1 is coupled to the ground, the current flowing through the source and drain of the NMOS transistor 800dT1 will be approximately $$\frac{W_{d1}/L_{d1}}{W_{d0}/L_{d0}}I_{n0},$$

where, $W_{d1}$ and $L_{d1}$ are the channel width and length of the NMOS transistor 800dT1, respectively; and $W_{d0}$ and $L_{d0}$ are the channel width and length of the NMOS transistor 800dT0, respectively. If a source terminal of any NMOS transistors 800dT1, 800dT2, 800dT3, ..., 800dTk is not electrically coupled to the ground but is floating, then no current flows through the transistor and to the overall output current Inout. The switches 800dS1, 800dS2, 800dS3, ..., 800dSk are controlled by switch control signals DTn1, DTn2, DTn3, ..., DTnk, respectively. The switch control signals DTn1, DTn2, DTn3, ..., DTnk may come from a dedicated controller (not shown). One would appreciate that each of the switches 800dS1, 800dS2, 800dS3, ..., 800dSk may simply be an NMOS transistor with the gate coupled to a switch control signal. Alternatively, one may use a pass-gates or other logic performing a similar function as the switch 800dS1, 800dS2, 800dS3, ..., or 800dSk.

The implementation of the programmable current mirrors is not limited to the exemplary implementations described above. Other programmable current mirrors are possible.

The trans-impedance amplifier (TIA) 700 is configured to be open-loop. There is no path from the output of the amplifier back to the amplifier input. Thus, there is no common-mode feedback to bias the trans-impedance amplifier 700. Very high bandwidth may be achieved due to the lack of a closed-loop feedback. The design can meet the requirement of 5G wireless communication whose bandwidth may be as high as 400 MHz or even more. The design also has the flexibility to support different bandwidth requirements. The PMOS transistors 700P1, 700P4 and/or the NMOS transistors 700N1, 700N4 may be programmed with different sizes to provide different load currents based on the type of signal it is processing or the mode in which the receiver operates. The receiver may operate to receive 2G, 3G, 4G, or 5G signals or other wireless signals. One may choose to program the PMOS transistors 700P1, 700P4 and/or the NMOS transistors 700N1, 700N4 with smaller sizes (thus smaller currents) when the receiver is in a mode for a lower bandwidth signal. For example, when the receiver is in a mode to receive a 5G wireless signal, the controller (not shown) may program PMOS transistors 700P1, 700P4 and/or the NMOS transistors 700N1, 700N4 with larger sizes to mirror higher currents for a higher bandwidth. When the receiver is in a mode to receive 3G or 4G wireless signals with lower bandwidth, the controller (not shown) may program PMOS transistors 700P1, 700P4 and/or the NMOS transistors 700N1, 700N4 to mirror smaller currents as 3G or 4G wireless signals may require a lower bandwidth than 5G signals. With reduced currents through the PMOS transistors 700P1, 700P4 and/or the NMOS transistors 700N1, 700N4, the power consumption is reduced, too.

The design of the trans-impedance amplifier (TIA) 700 also achieves a high linearity because of the use of a Class-AB architecture and the trans-linearity characteristics of the current mirrors. The trans-impedance amplifier (TIA) 700 also has a low input impedance. When used as the trans-impedance amplifier (TIA) 514 in FIG. 5, the low input impedance at baseband results in a low RF load presented to the output of the LNA 502 in FIG. 5 through the mixers 504I and 504Q, which further improves the receiver system linearity. The low input impedance also reduces the inductance requirement of 512L2P, 512L4P, 512L2N, and 512L4N, which saves cost and area. Further, noise is reduced by the minimal use of active devices in the filter.

The trans-impedance amplifier (TIA) 700 comprises a load impedance 708 with resistance $R_L$. The differential output signals OUTP and OUTN couple to the load impedance 708. The load impedance 708 may be programmed with different values for power saving, gain control, and/or impedance matching. The load impedance 708 may be programmed with different resistance values based on the type of signal it is processing or the mode in which the receiver operates. The receiver may operate to receive 2G, 3G, 4G, or 5G signals or other wireless signals. For example, when the resistance $R_L$ is tuned lower, the gain of the trans-impedance amplifier (TIA) 700 becomes lower but the TIA may be able to drive subsequent circuitry with higher BW, which may be needed when the receiver is at a mode for receiving a high-bandwidth 5G signal. For a relatively low-bandwidth 3G or 4G signal, higher gain may be desirable by making the resistance $R_L$ larger, which reduces the gain requirements on other circuitry and thus reduces the overall power consumption. The resistance $R_L$ may be adjusted for impedance matching purpose, too. The differential output signals OUTP and OUTN couple to a baseband processor (not shown) through transmission lines. A specific impedance may be required for the transmission lines. A typical impedance value of the load impedance 708 may be 50Ω.

Figure 9A:
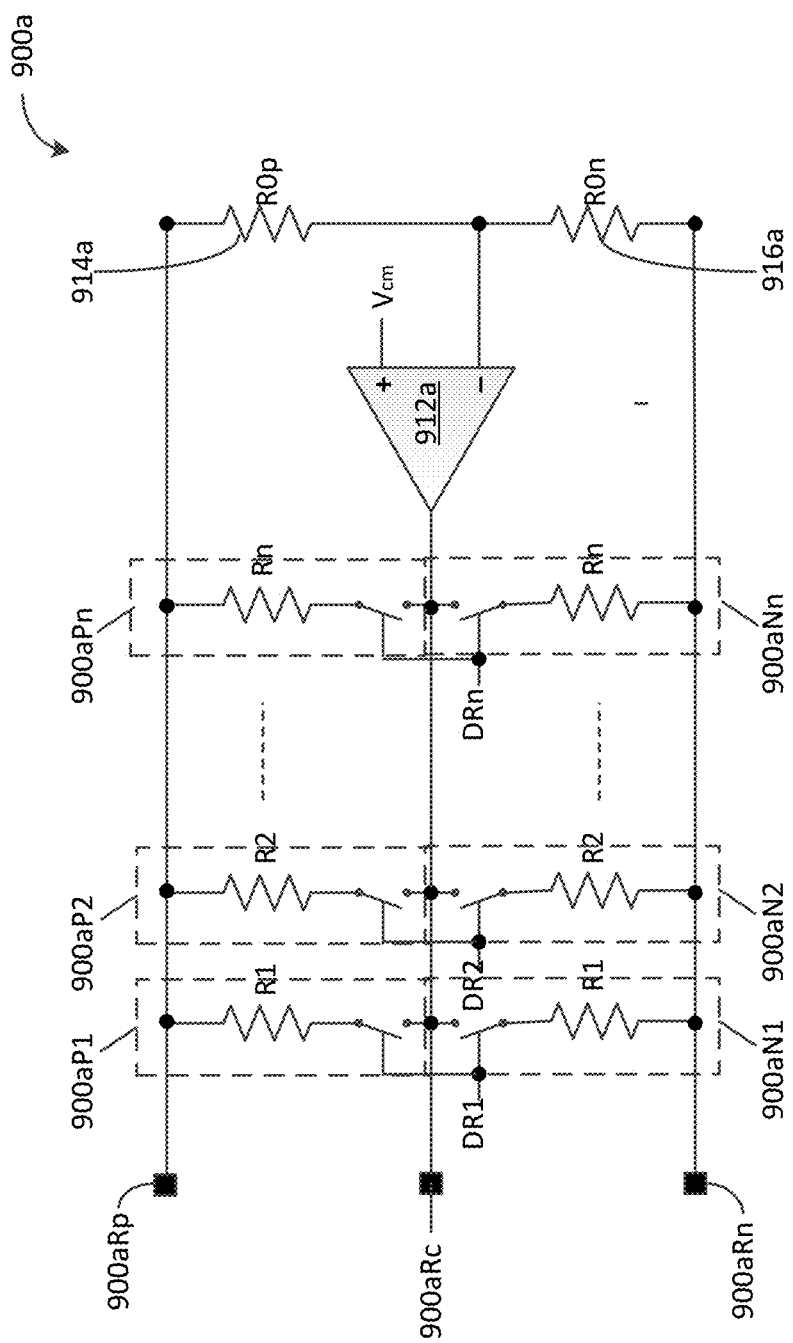
FIG. 9a illustrates an exemplary implementation of a programmable resistor network according to certain aspects of the present disclosure.

FIG. 9a illustrates an exemplary implementation of a programmable resistor network 900a that can be used as the load impedance 708 in FIG. 7. The programmable resistor network 900a comprises a terminal 900aRp and a terminal 900aRn as the two terminals of the equivalent resistor when used as the load impedance 708. The programmable resistor network 900a also comprises a center terminal 900aRc for setting a common-mode level.

Between the terminal 900aRp and the center terminal 900aRc, there are n resistor paths 900aP1, 900aP2, ..., 900aPn. Each of the resistor paths 900aP1, 900aP2, ..., 900aPn comprises a resistor with value R1, R2, ..., Rn, respectively. Each of the resistor paths 900aP1, 900aP2, ..., 900aPn also comprises a switch. The resistor in each of the resistor paths 900aP1, 900aP2, ..., 900aPn is electrically coupled or decoupled between terminal 900aRp and center terminal 900aRc by an operation of the corresponding switch. When the switch is on, the resistor is electrically coupled between terminal 900aRp and the center terminal 900aRc. Thus, the corresponding resistor contributes to the overall resistance between terminals 900aRp and 900aRn. When the switch is off, the corresponding resistor does not affect the overall resistance value between terminals 900aRp and 900aRn.

The programmable resistor network 900a also comprises n resistor paths 900aN1, 900aN2, ..., 900aNn between center terminal 900aRc and terminal 900aRn. Each of the resistor paths 900aN1, 900aN2, ..., 900aNn comprises a resistor with value R1, R2, ..., Rn, respectively. Each of the resistor paths 900aN1, 900aN2, ..., 900aNn also comprises a switch. The resistor in each of the paths 900aN1, 900aN2, ..., 900aNn is coupled or decoupled between terminal 900aRn and center terminal 900aRc by an operation of the corresponding switch. When the switch is on, the resistor is coupled between terminal 900aRp and the center terminal 900aRc. Thus, the corresponding resistor affects the overall resistance of the programmable resistor network 900a. When the switch is off, the corresponding resistor does not affect the overall resistance value of the programmable resistor network 900a between terminals 900aRp and 900aRn.

There may be a one-to-one match for the paths between the terminal 900aRp and the center terminal 900aRc and the paths between the center terminal 900aRc and the terminal 900aRn. For example, the path 900aP1 matches with the path 900aN1 and their corresponding resistors have the same resistance R1 and their switches are controlled by a same switch control signal DR1. That is, both paths will be either coupled to the network simultaneously or decoupled simultaneously. Similarly, the path 900aP2 matches with the path 900aN2 and their corresponding resistors have the same resistance R2 and their switches are controlled by a same switch control signal DR2. The match continues to the last two paths 900aPn and 900aNn where their corresponding resistors have the same resistance Rn and their switches are controlled by a same switch control signal DRn.

The programmable resistor network 900a further comprises a common-mode feedback circuit comprising an amplifier 912a and resistors 914a, 916a. The resistance value R0p for the resistor 914a and the resistance value R0n for the resistor 916a may be the same or different. The resistors 914a and 916a couple to the terminals 900aRp and 900aRn, respectively. The resistors 914a and 916a form a voltage divider that provides a feedback signal to the amplifier 912a. The amplifier 912a compares the feedback signal to the common-mode reference voltage Vcm to set an appropriate common-mode voltage at the center terminal 900aRc. The common-mode reference voltage Vcm may be generated by a voltage divider using the supply voltage, a bandgap voltage reference circuit, or any other appropriate circuitry. The amplifier 912a may be any differential input single-ended output amplifier with sufficient gain. When such a programmable resistor network 900a is used as the programmable load impedance 708 in FIG. 7, it is possible that the trans-impedance amplifier (TIA) 700 does not need its own common-mode feedback.

The resistance values R1, R2, . . . , Rn may be the same, or binary weighted (e.g., R1 may have the unit resistance value, R2 may be two times of the unit value, and Rn may be $2^{n-1}$ times of the unit value.), or weighted at other ratios. The switch control signals DR1, DR2, . . . , DRn may correspond to a binary control word from a controller (not shown). The switch control signals DR1, DR2, . . . , DRn may be Gray encoded, or coded in other ways. Therefore, if the resistance values R1, R2, . . . , Rn are with the same unit value R, and if p paths are turned on, then the effective resistance value between the terminals 900aRp and 900aRn would be $$2\frac{R}{p}.$$

There are other alternatives to the programmable resistor network 900a. For example, in each path, the resistor and the switch may change place. That is, one terminal of the resistor may couple to the center terminal 900aRc and the other terminal of the resistor may be selectively coupled to terminal 900aRp for the paths 900aP1, 900aP2, . . . , 900aPn and to terminal 900aRn for the resistor paths 900aN1, 900aN2, . . . , 900aNn by turning on or off the respective switches by the respective switch control signals DR1, DR2, . . . , DRn.

Figure 9B:
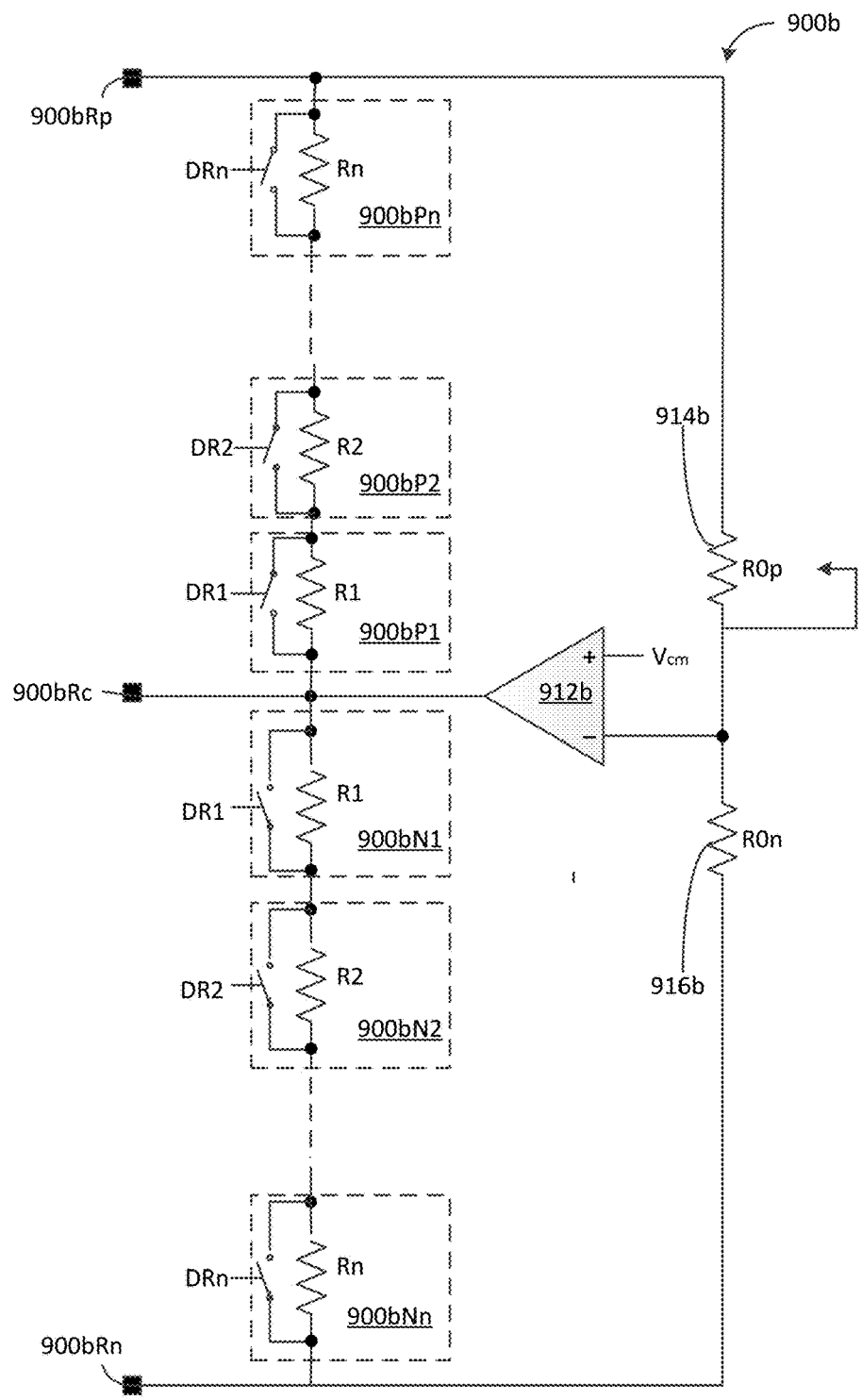
FIG. 9b illustrates still another exemplary implementation of a programmable resistor network according to certain aspects of the present disclosure.

Alternatively, the resistor paths may be in series. FIG. 9b illustrates an alternative exemplary implementation of a programmable resistor network according to certain aspects of the present disclosure. The programmable resistor network 900b may be used as the load impedance 708 in FIG. 7. Like the programmable resistor network 900a, the programmable resistor network 900b comprises terminal 900bRp and terminal 900bRn as the two terminals of the equivalent resistor. The programmable resistor network 900b also comprises a center terminal 900bRc for setting a common-mode level. Between the terminal 900bRp and the center terminal 900bRc, there are n resistor paths 900bP1, 900bP2, . . . , 900bPn. Each of the resistor paths 900bP1, 900bP2, . . . , 900bPn comprises a resistor with value R1, R2, . . . , Rn, respectively. Each of the resistor paths 900bP1, 900bP2, . . . , 900bPn also comprises a switch. Between the terminal 900bRn and the center terminal 900bRc, there are n resistor paths 900bN1, 900bN2, . . . , 900bNn. Each of the resistor paths 900bN1, 900bN2, . . . , 900bNn comprises a resistor with value R1, R2, . . . , Rn, respectively. Each of the resistor paths 900bN1, 900bN2, . . . , 900bNn also comprises a switch.

Unlike the programmable resistor network 900a, the n resistor paths 900bP1, 900bP2, . . . , 900bPn may be connected in series instead of in parallel, so are the resistor paths 900bN1, 900bN2, . . . , 900bNn. The switches are controlled by the switch control signals DR1, DR2, . . . , DRn. If a switch is on, the corresponding resistor is electrically bypassed, and thus does not contribute to the overall resistance of the programmable resistor network 900b. If the switch is off, the corresponding resistor is in serial connection with other resistors in the plurality of n resistor paths and contributes to the overall resistance of the programmable resistor network 900b.

Like 900a, the programmable resistor network 900b further comprises a common-mode feedback circuit comprising an amplifier 912b and resistors 914b, 916b. The amplifier 912b may be the same as the one 912a in FIG. 9a. The resistance value R0p for the resistor 914b and the resistance value R0n for the resistor 916b may be the same or different. The resistors 914b and 916b couple to the terminals 900bRp and 900bRn, respectively. The resistors 914b and 916b forms a voltage divider to provide a feedback signal to the amplifier 912b. The amplifier 912b compares the feedback signal to a common-mode reference voltage Vcm to set an appropriate common-mode voltage at a center terminal 900bRc. The common-mode reference voltage Vcm may be generated by a voltage divider using the supply voltage, a bandgap voltage reference circuit, or any other appropriate circuitry. When such a programmable resistor network 900b is used as the programmable load impedance 708 in FIG. 7, it is possible that the trans-impedance amplifier (TIA) 700 does not need its own common-mode feedback.

The resistance values R1, R2, . . . , Rn in FIG. 9b may be the same, or binary weighted (e.g., R1 may have the unit resistance value R, R2 may be two times of the unit value R, and Rn may be $2^{n-1}$ times of the unit value R.), or weighted at other ratios. The switch control signals DR1, DR2, . . . , DRn may correspond to a binary control word from a controller (not shown). The switch control signals DR1, DR2, . . . , DRn may be Gray encoded, or coded in other ways. Therefore, if the resistance values R1, R2, . . . , Rn are binary weighted and the switch control signals DR1, DR2, . . . , DRn are a natural binary word, then the effective resistance between the terminals 900bRp and 900bRn equals the value of the natural binary word times the two times of the unit resistance value R.

Back to FIG. 5 again, a dedicated resistor for the source impedance may not be needed for the doubly terminated LC ladder filter. The source impedance of the doubly terminated LC ladder filter, $R_{s,f}$, may derive from the output impedance of the in-phase mixer 504I. For local oscillator signals with 50% duty cycle, the output impedance of the in-phase mixer 504I can be expressed in simple terms approximately as $$R_{s,f} = R_{sw,I} + R_{out,LNA} // (R_{sw,Q} + R_{in,BB}).$$

Where $R_{sw,I}$ is the impedance of the in-phase mixer 504I; $R_{out,LNA}$ is the output impedance of the low noise amplifier (LNA) 502; $R_{sw,Q}$ is the impedance of the quadrature-phase mixer 504Q; and $R_{in,BB}$ is the input impedance of the quadrature-phase trans-impedance filter 506Q. In other words, the low noise amplifier (LNA) 502, the in-phase mixer 504I, the quadrature-phase mixer 504Q, and the trans-impedance filter (TIA) 506Q in the Q-Channel are configured to provide a source impedance to the doubly terminated LC ladder filter in the I-Channel.

A dedicated resistor for the load impedance may not be needed for the doubly terminated LC ladder filter either. The load impedance of the doubly terminated LC ladder filter, $R_{L,f}$, may derive from the input impedance of the trans-impedance amplifier (TIA) 514. The cost and area saving may be achieved without the dedicated resistor for the source impedance or the load impedance or using a smaller resistor for the source impedance or the load impedance.

Figure 10:
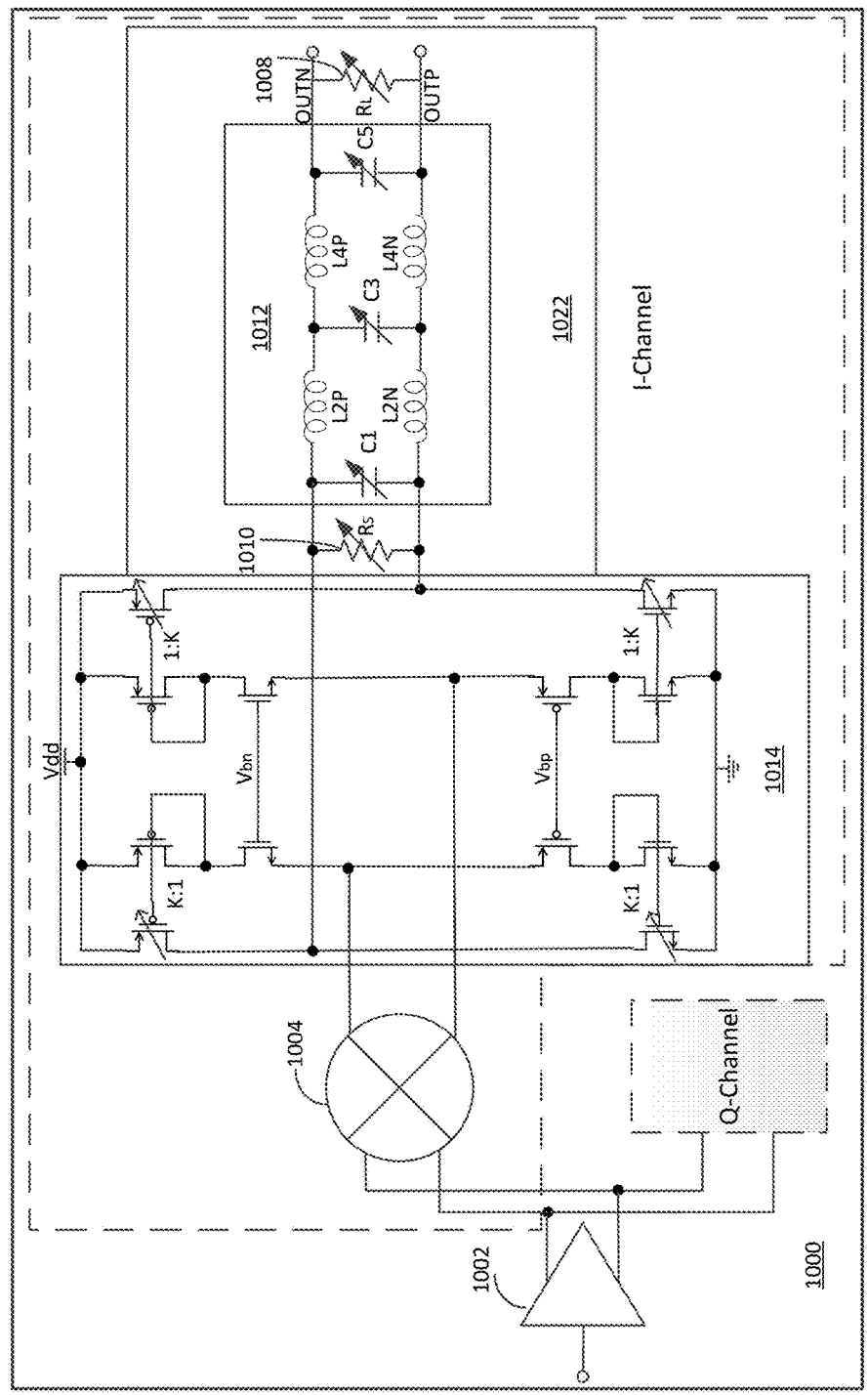
FIG. 10 illustrates still another example of an RF front-end receiver for high-bandwidth signals with an exemplary implementation of a doubly terminated LC ladder filter and a trans-impedance amplifier (TIA) according to certain aspects of the present disclosure.

FIG. 10 illustrates another example of an RF front-end receiver for high-bandwidth signals with an exemplary implementation of a doubly terminated LC ladder filter and a trans-impedance amplifier (TIA) according to certain aspects of the present disclosure. For ease and clarity of explanation, the following description focuses on the I-Channel only. And only the details of I-Channel design are shown in FIG. 10. The implementation of Q-Channel typically follows the same architecture and with the same design.

The receiver 1000 comprises a low noise amplifier (LNA) 1002. In the I-Channel, the differential output of the low noise amplifier (LNA) 1002 couples to a mixer 1004. The local oscillator signals provided to the mixer 1004 may have a 50% duty cycle to support high-bandwidth wireless RF signals. The down-converted signal from the mixer 1004 couples to a trans-impedance filter, which comprises a trans-impedance amplifier (TIA) 1014 and a doubly terminated LC ladder filter 1022. The output of the mixer 1004 couples to the trans-impedance amplifier (TIA) 1014. The output of the trans-impedance amplifier (TIA) 1014 couples to the doubly terminated LC ladder filter 1022. The doubly terminated LC ladder filter 1022 couples to a load impedance 1008 and generates the differential output signals OUTP and OUTN.

The trans-impedance amplifier (TIA) 1014 may have the similar design and operate in the similar way as the trans-impedance amplifier (TIA) 514 in FIG. 5 or as the trans-impedance amplifier (TIA) 700 illustrated in FIG. 7. The trans-impedance amplifier (TIA) 1014 is programmable with the current mirrors as loads. The current mirror loads may be implemented as illustrated in FIGS. 8a-d. The doubly terminated LC ladder filter 1022 comprises an inductor and capacitor (LC) network 1012. The inductor and capacitor (LC) network 1012 may be the same as the inductor and capacitor (LC) network 512 in FIG. 5 and may be programmable with capacitors implemented as illustrated in FIG. 6.

The doubly terminated LC ladder filter 1022 further comprises a source resistor 1010 that provides a source impedance for the filter. A typical source impedance value $R_s$ would be 50Ω. The source resistor 1010 may be programmable for power saving, gain control, and/or impedance matching. The source resistor 1010 may be programmed with different values base on the type of signal it is processing or the mode the receiver operates. The receiver may operate to receive 2G, 3G, 4G, or 5G signals or other wireless signals. For example, when the resistance $R_s$ is tuned lower, the gain of the trans-impedance amplifier (TIA) 1014 becomes lower, which may be needed when the receiver operates in a mode receiving a high-bandwidth 5G signal. For a relatively low-bandwidth 3G or 4G wireless signal, a larger gain may be use by making the resistance $R_s$ larger, which reduces the gain requirements on other circuitry and thus reduces the overall power consumption. The resistance $R_s$ may be adjusted for impedance matching purpose as well.

The source resistor 1010 may be implemented as illustrated in FIG. 9a or 9b or any other suitable fashions. When a programmable resistor network 900a of FIG. 9a or 900b of FIG. 9b is used as the source resistor 1010, it is possible that the trans-impedance amplifier (TIA) 1014 does not need its own common-mode feedback and may operate with open-loop configuration. The trans-impedance amplifier (TIA) 1014 may be implemented as one illustrated in FIG. 7 except the load impedance 708. A dedicated load impedance is not required. The doubly terminated LC ladder filter 1022 provides the load to the trans-impedance amplifier (TIA) 1014. The load to the trans-impedance amplifier (TIA) 1014 may be programmable by the programming of the doubly terminated LC ladder filter 1022. The bias voltages to the trans-impedance amplifier (TIA) 1014 are generated without receiving the output signals of the trans-impedance amplifier (TIA) 1014.

The source or load resistors 1010 and 1008 of the doubly terminated LC ladder filter 1022 may be disconnected, which results in a high-impedance source or load (essentially a singly-terminated LC ladder filter). Such configuration potentially save power consumption.

Figure 11:
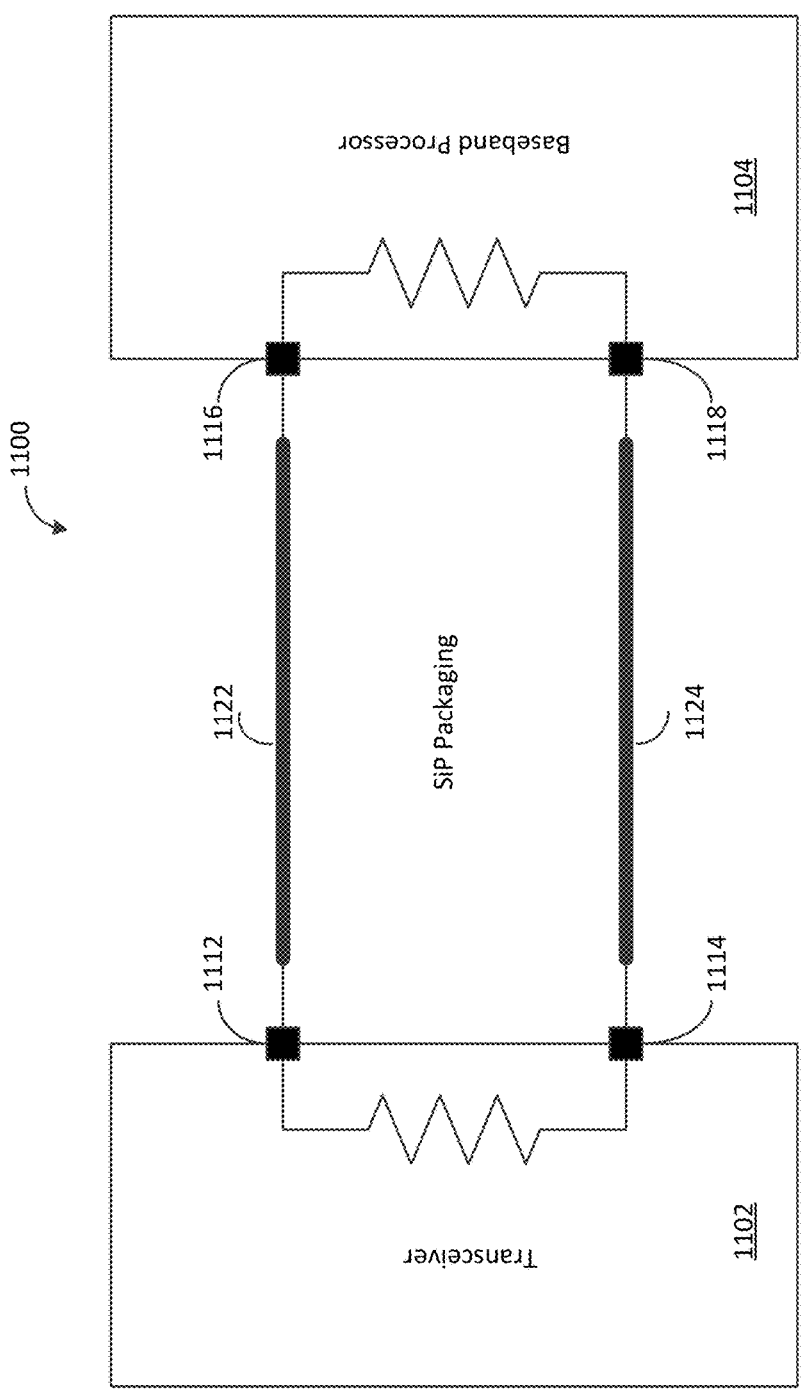
FIG. 11 illustrates an example configuration of a transceiver and a baseband processor according to certain aspects of the present disclosure.

FIG. 11 illustrates an example configuration of a transceiver and a baseband processor according to certain aspects of the present disclosure. The system 1100 comprises a transceiver 1102 and a baseband processor 1104. The transceiver 1102 and the baseband processor 1104 each may be implemented in a different die but may be packaged together in a system-on-package (SiP) or they may be two separate chips. The connections between the transceiver 1102 and the baseband processor 1104 are through transmission lines 1122 and 1124 for some signals, such as the differential output signals OUTP and OUTN in FIG. 5 or FIG. 10. At the ends of the transmission lines 1122 and 1124 are terminals 1112, 1114, 1116, and 1118. Terminals 1112 and 1114 may be IO pads of the transceiver 1102, while terminals 1116 and 1118 may be IO pads of the baseband processor 1104. Typically, an IO pad is coupled to ESD protection circuitry. There may be significant parasitic capacitance associated with the IO pad. One may consider using the parasitic capacitance as part of the inductor and capacitor (LC) network 1012 in FIG. 10. For example, the capacitance value C5 in FIG. 10 may come from the IO terminals 1112, 1114, 1116, and 1118. The use of the parasitic capacitance may save area and reduce the side effect of the parasitic capacitance.

The load impedance 708 or 1008 may be implemented fully in the transceiver 1102 side, or fully in the baseband processor 1104 side, or may be split between the transceiver 1102 and the baseband processor 1104.

Figure 12:
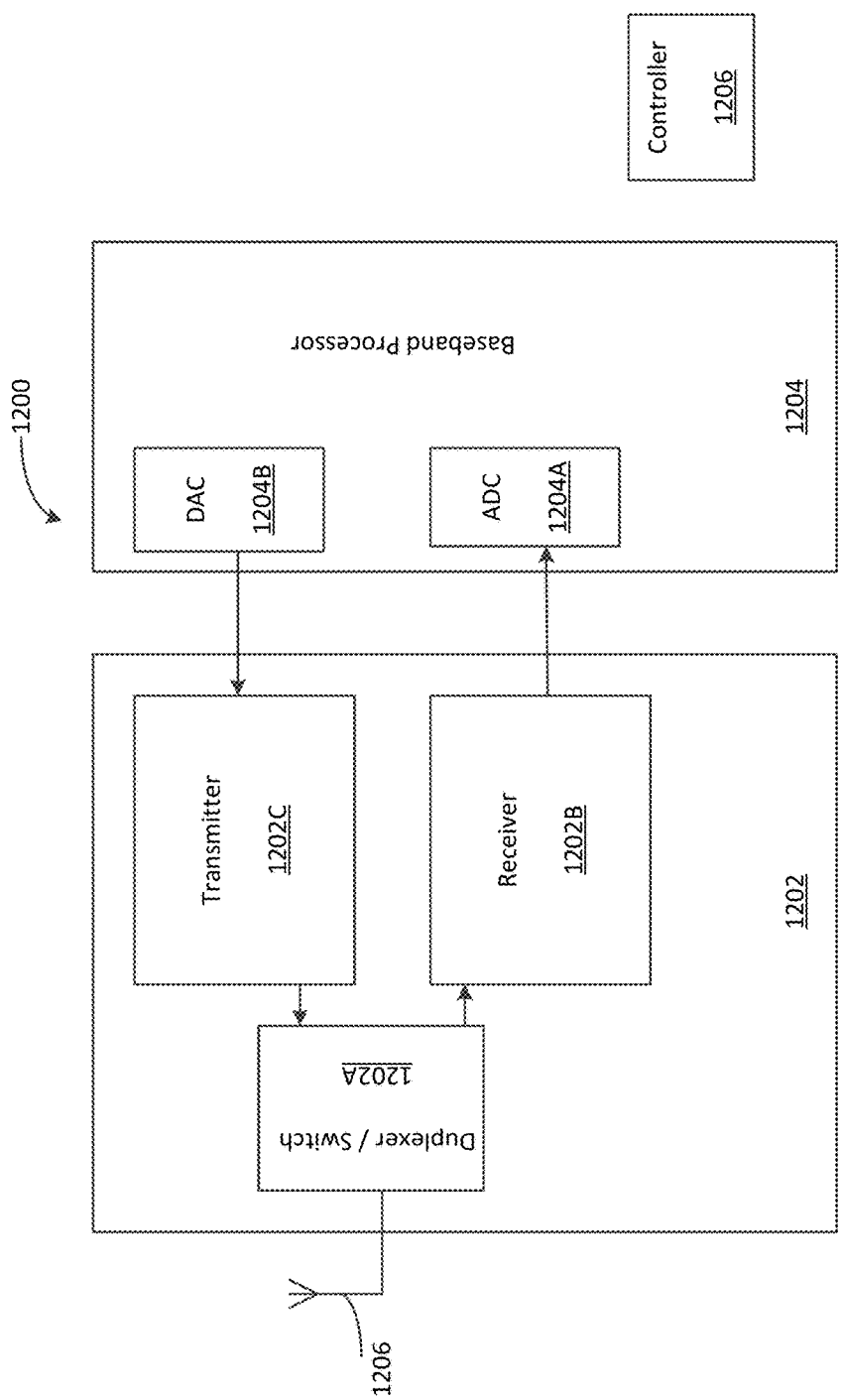
FIG. 12 illustrates an example of an RF front-end system according to certain aspects of the present disclosure.

FIG. 12 illustrates an example RF front-end system according to certain aspects of the present disclosure. The system 1200 comprises an antenna 1206 configured to receive wireless RF signals, including 5G wireless RF signals. The antenna 1206 is shared between a receiver 1202B and a transmitter 1202C through a duplexer/switch 1202A. The duplexer/switch 1202A, the receiver 1202B, and the transmitter 1202C may be integrated in a transceiver 1202. The receiver 1202B may be implemented with circuitry illustrated in FIGS. 1-10. When the transceiver 1202 is configured in a receiving mode, the wireless RF signal is received by the antenna 1206 and is routed to the receiver 1202B through the duplexer/switch 1202A. After processing, the receiver generates a baseband signal and provides the baseband signal to the baseband processor 1204 through an analog-to-digital converter (ADC) 1204A. when the transceiver 1202 is configured in a transmission mode, the baseband processor 1204 generates a baseband signal. The baseband signal is sent to the transmitter 1202C through a digital-to-analog converter (DAC) 1204B. The transmitter 1202C converts the baseband signal to a high-frequency RF signal. The high-frequency RF signal is routed to the antenna 1206 for broadcasting through the duplexer/switch 1202A. The system 1200 may be configured in various modes. For example, the system 1200 may transmit or receive 2G, 3G, 4G, or 5G signals with different bandwidths.

The system 1200 may further comprise a controller 1206. The controller 1206 may be integrated as part of the transceiver 1202, or baseband processor 1204, or other module/dies, or as a standalone component, or as a combination thereof. The controller 1206 may determine the operating mode of the transceiver 1202 and/or the baseband processor 1204. The controller 1206 may provide the control signals to program the current mirrors to adjust the load currents for a trans-impedance amplifier (TIA) if the trans-impedance amplifier (TIA) is designed similarly to the one illustrated in FIG. 7. The controller 1206 may also provide the control signals to adjust the resistor or capacitor values for programmable resistors and/or programmable capacitors as illustrated in FIGS. 8a-d and/or FIGS. 9a-b.

Figure 13:
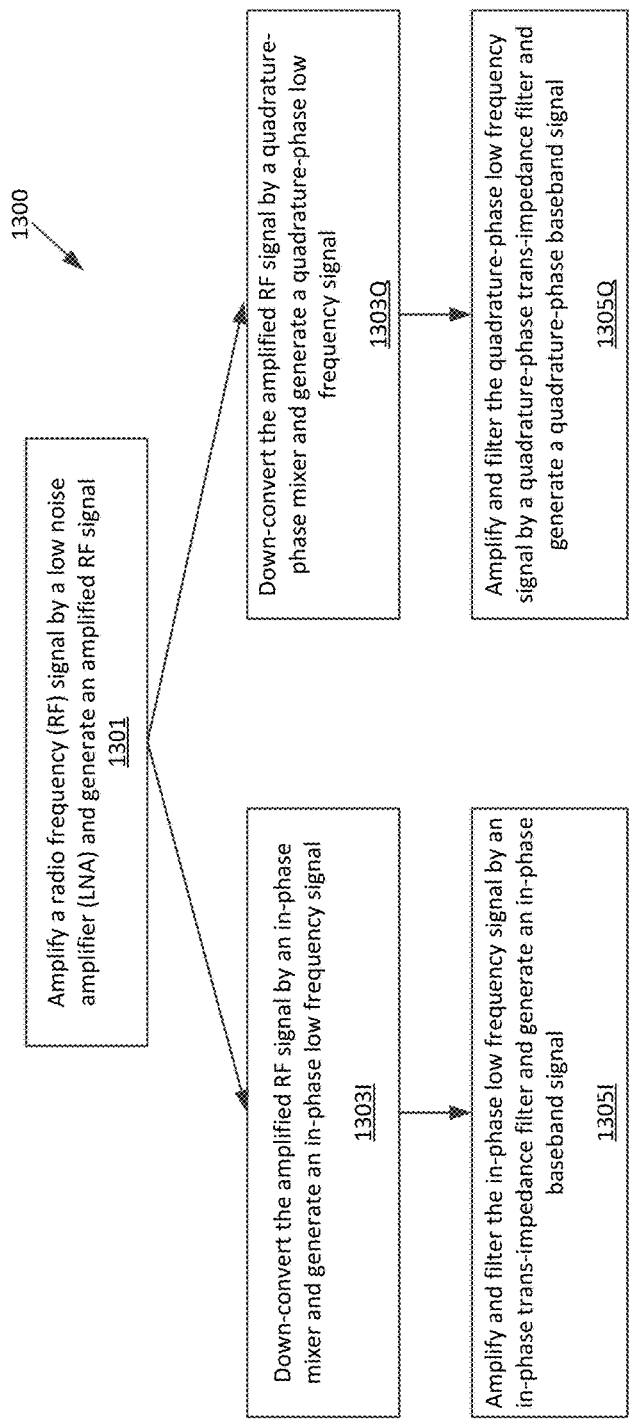
FIG. 13 illustrates an example method for processing a wireless RF communication signal according to certain aspects of the present disclosure.

FIG. 13 illustrates an example method 1300 for processing a wireless RF communication signal according to certain aspects of the present disclosure. At 1301, a low noise amplifier (LNA) (e.g., the low noise amplifier (LNA) 202, 502, or 1002) amplifies a radio frequency (RF) signal and generates an amplified RF signal. The radio frequency (RF) signal may include a 5G wireless communication or other RF signal with a bandwidth exceeding 100 MHz, or 400 MHz, or higher. The amplified RF signal couples to both an I-Channel and a Q-Channel. The low noise amplifier (LNA) is shared by both I-Channel and Q-Channel.

At 1303I, the amplified RF signal is down-converted by an I-Channel mixer (e.g., the mixer 202I, 504I, or 1004). The I-Channel mixer is clocked by differential local oscillator (LO) signals having a relatively large duty cycle, such as approximately 50% duty cycle. The I-Channel mixer generates an in-phase low-frequency signal.

At 1305I, the in-phase low-frequency signal couples to an I-Channel trans-impedance filter (e.g., the trans-impedance filter 206I, 506I, or 1006I). The I-Channel trans-impedance filter amplifies and filters the in-phase low-frequency signal and generates an in-phase baseband signal. The I-Channel trans-impedance filter comprises a tunable inductor and capacitor (LC) network that is a portion of a low pass filter and a trans-impedance amplifier (TIA) coupled to the tunable inductor and capacitor (LC) network.

The low pass filter may support high-bandwidth signals, such as 5G signal that may have a bandwidth at or higher than 400 MHz. In some implementation, the capacitance value for each capacitor in the tunable inductor and capacitor (LC) network is adjustable by a controller. The capacitance value for each capacitor in the tunable inductor and capacitor (LC) network may have a base value as the minimum capacitance. The bandwidth of the low pass filter may be tuned by adjusting the capacitance value of the tunable inductor and capacitor (LC) network. The bandwidth of the low pass filter may be tuned to be lower when the receiver is in one mode, such as receiving 2G, 3G, or 4G signals, and higher for another mode, such as receiving 5G signals.

The trans-impedance amplifier (TIA) may have a differential input and a differential output. The trans-impedance amplifier (TIA) is configured to be open-loop and without common-mode feedback. The trans-impedance amplifier (TIA) comprises a programmable PMOS current mirror and a programmable NMOS current mirror as loads. The currents for the programmable PMOS current mirror and/or the programmable NMOS current mirror may be adjusted lower when the receiver is in one mode, such as receiving 2G, 3G, or 4G signals, and higher for another mode, such as receiving 5G signals.

The trans-impedance filter (TIA) also comprises a load impedance. In I-Channel, the trans-impedance amplifier (TIA) drives an in-phase load impedance with the in-phase baseband signal. The in-phase load impedance may be programmable (e.g., programmable resistor network 900a or 900b). The gain of the trans-impedance amplifier (TIA) may be adjusted by changing a value of the in-phase load impedance. The resistance may be adjusted to be lower, thus lower gain for the trans-impedance amplifier (TIA) when the receiver is in one mode, such as receiving 5G signals, and higher, thus larger gain for the trans-impedance amplifier (TIA) for another mode, such as receiving 2G, 3G, or 4G signals.

The Q-Channel may operate similarly to the I-Channel. Like the I-Channel, at 1303Q, the amplified RF signal is down-converted by a Q-Channel mixer (e.g., 204Q, 504Q). The Q-Channel mixer is clocked by differential local oscillator (LO) signals having a relatively large duty cycle, such as approximately 50% duty cycle. The Q-Channel mixer generates a quadrature-phase low-frequency signal. The local oscillator (LO) signals for the Q-Channel are 90-degree offset from the corresponding local oscillators (LO) signals for the I-Channel.

At 1305Q, the Q-Channel trans-impedance filter amplifies and filters the quadrature-phase low-frequency signal and generates a quadrature-phase baseband signal. The Q-Channel trans-impedance filter may operate similarly to the I-Channel trans-impedance filter.

The Q-Channel trans-impedance amplifier drives the quadrature-phase load impedance with the quadrature-phase baseband signal. The quadrature-phase load impedance may operate similarly to the in-phase load impedance.

The low pass filter in I-Channel may be a doubly terminated LC ladder filter. Taking advantage of 50% or near 50% duty cycle local oscillator signals, the source impedance of the doubly terminated LC ladder filter may derive from the output resistance of the in-phase mixer (e.g., with the configuration of FIG. 5). The output impedance of the in-phase mixer may be provided by the low noise amplifier (LNA), the in-phase mixer, the quadrature-phase mixer, and the Q-Channel trans-impedance filter. Alternatively, a dedicated source resistor may be provided to be used as the source impedance of the doubly terminated LC ladder filter (e.g., with the configuration of FIG. 10). Alternatively, the source impedance may be a combination of a dedicated source resistor and the output impedance of the in-phase mixer. If a dedicated source resistor is used, it may be programmable (e.g., programmable resistor network 900a or 900b).

The load impedance of the doubly terminated LC ladder filter may derive from the input impedance of the in-phase trans-impedance amplifier (TIA) (e.g., with the configuration of FIG. 5) or from the in-phase load impedance (e.g., with the configuration of FIG. 10), or a combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A circuit, comprising:
   a low noise amplifier (LNA) configured to receive a radio frequency (RF) signal;
   a first mixer coupled to the low noise amplifier (LNA);
   a first trans-impedance filter coupled to the first mixer, wherein the first trans-impedance filter comprises
      a tunable inductor and capacitor (LC) network configured to be a portion of a doubly terminated LC ladder filter; and
      a trans-impedance amplifier (TIA) coupled to the tunable inductor and capacitor (LC) network;
   a second mixer coupled to the low noise amplifier (LNA); and
   a second trans-impedance filter coupled to the second mixer.

2. The circuit of claim 1, wherein the first mixer and the second mixer are configured to be clocked by differential local oscillator (LO) signals having approximately 50% duty cycle.

3. The circuit of claim 1, wherein the doubly terminated LC ladder filter is configured to have a bandwidth greater than 400 MHz.

4. The circuit of claim 1, wherein the tunable inductor and capacitor (LC) network comprises a programmable capacitor array.

5. The circuit of claim 4, wherein the doubly terminated LC ladder filter is configured to have different bandwidths by programming the programmable capacitor array.

6. The circuit of claim 1, wherein the trans-impedance amplifier (TIA) comprises a programmable current mirror configured to provide a load current.

7. The circuit of claim 6, wherein the trans-impedance amplifier (TIA) further comprise a common-gate amplifier coupled to the programmable current mirror.

8. The circuit of claim 7, wherein the programmable current mirror is configured to provide a lower load current when the trans-impedance amplifier (TIA) is configured to operate in a first mode than in a second mode.

9. The circuit of claim 8, wherein the doubly terminated LC ladder filter is configured to have a lower bandwidth when the trans-impedance amplifier (TIA) is configured to operate in the first mode than in the second mode.

10. The circuit of claim 1, wherein the trans-impedance amplifier (TIA) is configured to operate in open-loop and without a common-mode feedback circuit.

11. The circuit of claim 1, wherein the trans-impedance amplifier (TIA) comprises an input coupled to the tunable inductor and capacitor (LC) network and wherein the tunable inductor and capacitor (LC) network is coupled to the first mixer.

12. The circuit of claim 11, wherein the low noise amplifier (LNA), the first mixer, the second mixer, and the second trans-impedance filter (TIA) are configured to provide a source impedance to the doubly terminated LC ladder filter.

13. The circuit of claim 1, wherein the trans-impedance filter further comprises a programmable source resistor; wherein the trans-impedance amplifier (TIA) comprises an input coupled to the first mixer and an output coupled to the programmable source resistor; and wherein the tunable inductor and capacitor (LC) network is configured to couple to the programmable source resistor.

14. The circuit of claim 1, wherein the trans-impedance amplifier (TIA) comprises a load impedance having:
   a first terminal;
   a second terminal;
   a center terminal;
   a plurality of first resistors and a plurality of first switches, wherein each of the plurality of first resistors is configured to be coupled or decoupled from the first terminal and the center terminal by an operation of the corresponding one of the plurality of first switches;
   a plurality of second resistors and a plurality of second switches, wherein each of the plurality of second resistors is configured to be coupled or decoupled from the second terminal and the center terminal by an operation of the corresponding one of the plurality of second switches.

15. The circuit of claim 14, wherein the center terminal is configured to be driven by a common-mode voltage.

16. A method, comprising
   amplifying a radio frequency (RF) signal by a low noise amplifier (LNA) to generate an amplified RF signal;
   down-converting the amplified RF signal by a first mixer to generate a first low-frequency signal;
   amplifying and filtering the first low-frequency signal by a first trans-impedance filter to generate a first baseband signal, wherein the trans-impedance filter comprises
      a tunable inductor and capacitor (LC) network configured to be a portion of a doubly terminated LC ladder filter; and
      a trans-impedance amplifier (TIA) coupled to the tunable inductor and capacitor (LC) network;
   down-converting the amplified RF signal by a second mixer to generate a second low-frequency signal; and
   amplifying and filtering the second low-frequency signal by a second trans-impedance filter to generate a second baseband signal.

17. The method of claim 16 further comprises adjusting a capacitance value of the tunable inductor and capacitor (LC) network to adjust a bandwidth of the doubly terminated LC ladder filter.

18. The method of claim 16 further comprises providing a lower load current to the trans-impedance amplifier (TIA) for an operation in a first mode than in a second mode.

19. The method of claim 18 further comprises tuning the doubly terminated LC ladder filter to have a lower bandwidth for an operation in the first mode than in the second mode.

20. The method of claim 16 further comprises operating the trans-impedance amplifier (TIA) in open-loop and without a common-mode feedback.

21. The method of claim 16, wherein the trans-impedance amplifier (TIA) comprises an input coupled to the tunable inductor and capacitor (LC) network; and wherein the tunable inductor and capacitor (LC) network is configured to couple to the first mixer.

22. The method of claim 21 further comprises providing a source impedance to the doubly terminated LC ladder filter by the low noise amplifier (LNA), the first mixer, the second mixer, and the second trans-impedance filter.

23. The method of claim 16, wherein the trans-impedance amplifier (TIA) comprises a programmable load impedance.

24. The method of claim 23 further comprises setting a common-mode voltage of the programmable load impedance.

25. A circuit, comprising
means for amplifying a radio frequency (RF) signal and generating an amplified RF signal;
means for down-converting the amplified RF signal and generating a first low-frequency signal;
means for amplifying and filtering the first low-frequency signal and generating a first baseband signal, wherein the means for amplifying and filtering the first low-frequency signal and generating a first baseband signal comprises a tunable inductor and capacitor (LC) network configured to be a portion of a doubly terminated LC ladder filter; and
a trans-impedance amplifier (TIA) coupled to the tunable inductor and capacitor (LC) network;
means for down-converting the amplified RF signal and generating a second low-frequency signal; and
means for amplifying and filtering the second low-frequency signal and generating a second baseband signal.

26. The circuit of claim 25 further comprises means for adjusting a bandwidth of the doubly terminated LC ladder filter.

27. The circuit of claim 25 further comprises means for providing a lower load current to the trans-impedance amplifier (TIA) when the trans-impedance amplifier (TIA) is configured to operate in a first mode than in a second mode.

28. The circuit of claim 27 further comprises means for tuning the doubly terminated LC ladder filter to have a lower bandwidth for an operation in the first mode than in the second mode.

29. The circuit of claim 25, wherein the trans-impedance amplifier (TIA) is configured to operate in open-loop and without a common-mode feedback circuit.

30. The circuit of claim 25, wherein the means for amplifying and filtering the first low-frequency signal and generating a first baseband signal comprises means for setting a common-mode voltage.

* * * * *